(12) United States Patent
Takahashi et al.

(10) Patent No.: US 9,551,753 B2
(45) Date of Patent: Jan. 24, 2017

(54) ELECTRIC STORAGE SYSTEM DETERMINING OPERATION OF CURRENT BREAKER

(75) Inventors: Kenji Takahashi, Toyota (JP); Yuji Nishi, Nagoya (JP); Hiroyuki Kaiya, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 135 days.

(21) Appl. No.: 14/419,390

(22) PCT Filed: Aug. 9, 2012

(86) PCT No.: PCT/JP2012/005086
§ 371 (c)(1),
(2), (4) Date: Feb. 3, 2015

(87) PCT Pub. No.: WO2014/024226
PCT Pub. Date: Feb. 13, 2014

(65) Prior Publication Data
US 2015/0212158 A1    Jul. 30, 2015

(51) Int. Cl.
*H01M 10/46* (2006.01)
*G01R 31/327* (2006.01)
*H01M 10/48* (2006.01)
*H02J 7/14* (2006.01)
*B60L 11/18* (2006.01)
(Continued)

(52) U.S. Cl.
CPC ........ *G01R 31/3274* (2013.01); *B60L 11/1864* (2013.01); *G01R 31/3644* (2013.01); *H01M 10/48* (2013.01); *H02J 7/1461* (2013.01); *B60L 2240/545* (2013.01); *B60L 2240/547* (2013.01); *B60L 2240/549* (2013.01); *B60L 2270/20* (2013.01); *H02J 7/345* (2013.01); *Y02T 10/7005* (2013.01); *Y02T 10/7061* (2013.01)

(58) Field of Classification Search
CPC ...... H02J 7/1423; H02J 7/0013; H02J 7/0026; H02J 7/0021; H02J 2007/005
USPC ........ 320/107, 112, 116, 132, 149; 324/426, 324/427, 433
See application file for complete search history.

(56) References Cited

U.S. PATENT DOCUMENTS

2011/0148361 A1    6/2011  Yokotani
2013/0027047 A1*   1/2013  Yoshioka ........... G01R 31/3651
                                                              324/426

FOREIGN PATENT DOCUMENTS

JP    H05-275116 A    10/1993
JP    2008-182779 A   8/2008
(Continued)

*Primary Examiner* — Edward Tso
(74) *Attorney, Agent, or Firm* — Oliff PLC

(57) ABSTRACT

The state of a plurality of electric storage blocks connected in serial is determined. Each of the electric storage blocks includes a plurality of electric storage elements connected in parallel. Each of the electric storage elements includes a current breaker configured to break a current path in the electric storage element. When a first voltage characteristic is shifted from a second voltage characteristic, it is determined that the current breaker is operated. The first voltage characteristic is acquired from a voltage sensor acquiring an open circuit voltage of each electric storage block and indicates a change in the open circuit voltage with respect to a capacity of the electric storage block. The second voltage characteristic is calculated from a capacity retention rate and a variation of the capacity and indicates a change in the open circuit voltage with respect to the capacity of the electric storage block.

7 Claims, 10 Drawing Sheets

(51) Int. Cl.
*G01R 31/36* (2006.01)
*H02J 7/34* (2006.01)

(56) References Cited

FOREIGN PATENT DOCUMENTS

JP 2011-135657 A 7/2011
WO 2011/128756 A1 10/2011

* cited by examiner

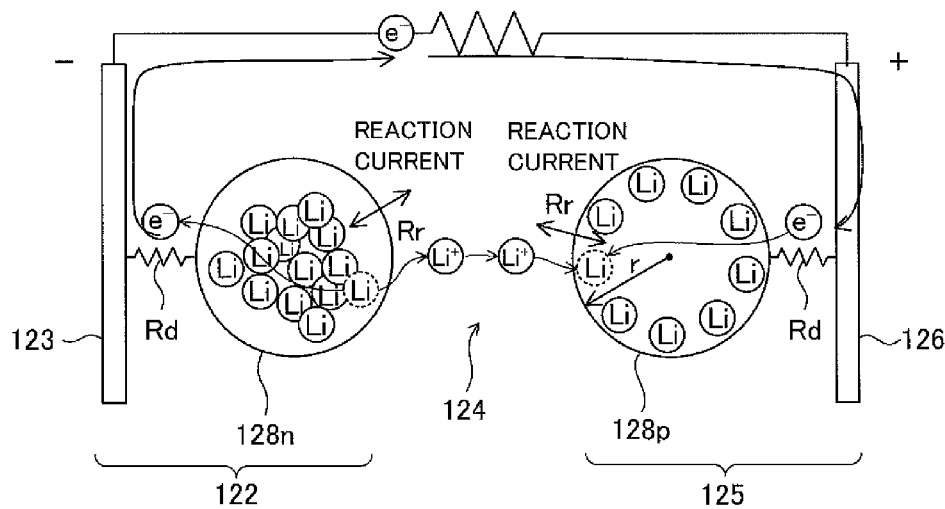
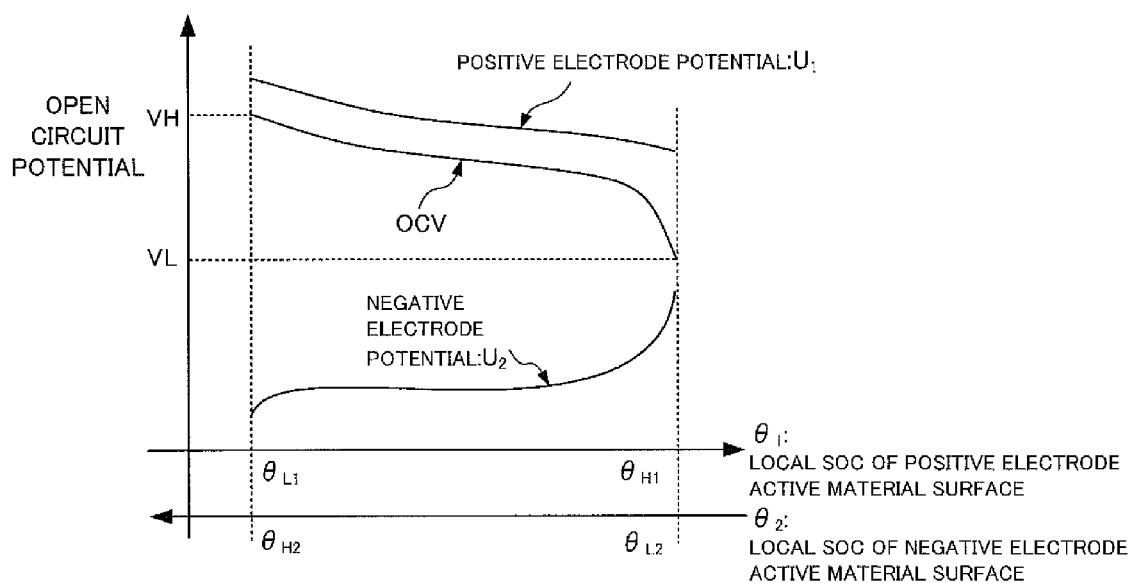
FIG. 5

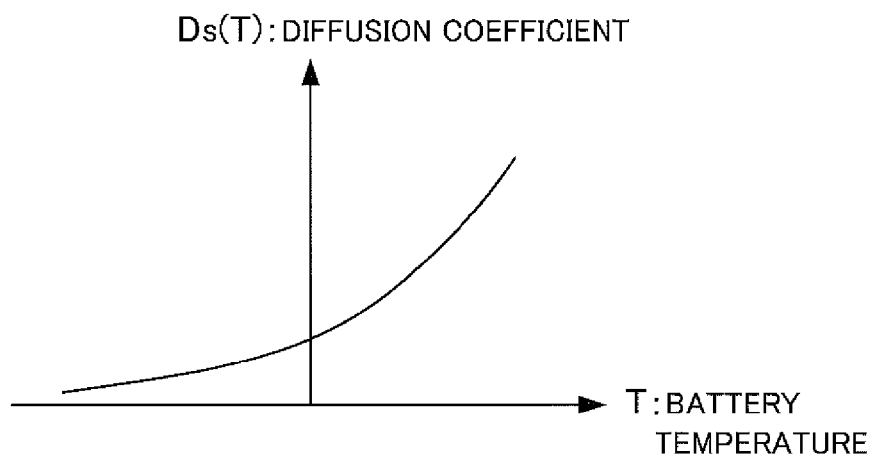
FIG. 7
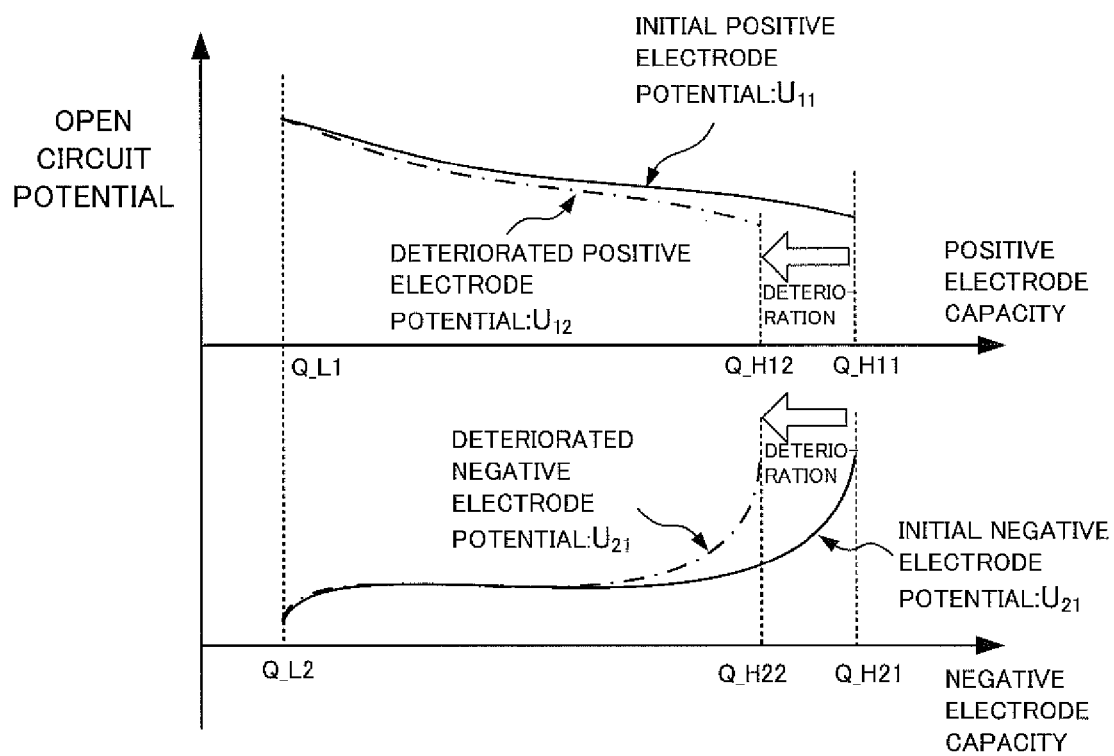

ELECTRIC STORAGE SYSTEM DETERMINING OPERATION OF CURRENT BREAKER

TECHNICAL FIELD

The present invention relates to an electric storage system including electric storage blocks in each of which a plurality of electric storage elements having respective current breakers are connected in parallel and determining an operating state of the current breaker.

BACKGROUND ART

Patent Document 1 has described an assembled battery having a configuration in which a plurality of cells are connected in parallel and a fuse is connected to each of the cells connected in parallel. The fuse blows in response to passage of an excessive current to break the current path. Patent Document 2 has described a technique in which the operation of a current breaking mechanism included in a battery is detected on the basis of a change in internal resistance of the battery.

PRIOR ART DOCUMENTS

Patent Documents

[Patent Document 1] Japanese Patent Laid-Open No. 05-275116
[Patent Document 2] Japanese Patent Laid-Open No. 2008-182779
[Patent Document 3] Japanese Patent Laid-Open No. 2011-135657

DISCLOSURE OF THE INVENTION

Problems to be Solved by the Invention

In the configuration in which the plurality of cells are connected in parallel, when one of the current breakers is operated, the value of current passing through the other cells connected to the inoperative current breakers is changed. Specifically, when the current breaker is operated, the value of current passing through the other cells connected to the inoperative current breakers rises to increase the current load on the cells. It is thus necessary to detect the operation of the current breaker in order to control charge and discharge of the cells. It is an object of the present invention to detect the operation of a current breaker with a method different from the technique described in Patent Document 2.

Means for Solving the Problems

According to a first aspect, the present invention provides an electric storage system including a plurality of electric storage blocks, a plurality of current breakers, a voltage sensor, and a controller. The electric storage block includes a plurality of electric storage elements connected in parallel, and the plurality of electric storage blocks are connected in serial. The current breaker is provided for each of the electric storage elements and is configured to break a current path in the electric storage element. The voltage sensor is used for acquiring the open circuit voltage of the electric storage block.

In each of the electric storage blocks, a single electrode capacity retention rate and a variation of a capacity of the electric storage block are defined below.

The capacity retention rate is defined by dividing capacity of single electrode in deteriorated state by capacity of single electrode in initial state.

The variation of the capacity is defined by multiplying capacity of negative electrode in deteriorated state by shift amount of negative electrode composition axis relative to positive electrode composition axis.

The controller determines that the current breaker is operated when a first voltage characteristic is shifted from a second voltage characteristic. The first voltage characteristic is acquired from the voltage sensor and indicates a change in the open circuit voltage with respect to the capacity of the electric storage block. The second voltage characteristic is calculated from the capacity retention rate and the variation of the capacity and indicates a change in the open circuit voltage with respect to the capacity of the electric storage block.

In the first aspect of the present invention, when only the deterioration of the electric storage element occurs, the second voltage characteristic coincides with the first voltage characteristic. Once the current breaker is operated, no current passes in the electric storage element provided with that operating current breaker to reduce the capacity of the electric storage block including that operating current breaker. Thus, when the current breaker is operated, the first voltage characteristic is shifted from the second voltage characteristic observed when only the deterioration of the electric storage element occurs. As a result, the presence or absence of the shift of the first voltage characteristic from the second voltage characteristic is examined to allow the determination of whether or not the current breaker is operated.

In a first method of comparing the first voltage characteristic with the second voltage characteristic, a first sum value is first calculated by summing currents acquired from a current sensor during a change in the open circuit voltage of the electric storage block (discharge or charge) from a first voltage to a second voltage. A second sum value is calculated by using the second voltage characteristic, the second sum value being a current sum value during a change in the open circuit voltage of the electric storage block (discharge or charge) from the first voltage to the second voltage. When the first voltage characteristic is shifted from the second voltage characteristic, the first sum value is different from the second sum value. It can be determined that the current breaker is operated when the difference between the first sum value and the second sum value is equal to or larger than a predetermined value.

In a second method of comparing the first voltage characteristic with the second voltage characteristic, a sum value is first calculated by summing currents acquired from the current sensor during a change in the open circuit voltage of the electric storage block from the first voltage to the second voltage. An estimated voltage is calculated by using the second voltage characteristic, the estimated voltage being a voltage obtained when the capacity of the electric storage block is changed by the sum value from a capacity level associated with the first voltage. When the first voltage characteristic is shifted from the second voltage characteristic, the actually measured second voltage is different from the estimated voltage. It can be determined that the current breaker is operated when the difference between the second voltage and the estimated voltage is equal to or larger than a predetermined value.

The calculation of the second voltage characteristic can be performed by using information indicating an equal characteristic to that of the first voltage characteristic at the first voltage and a third voltage which is different from the second voltage. The deteriorated state can be a deteriorated state occurring due to wear of the electric storage element. For the deterioration due to wear, the relationship between the capacity retention rate and the variation of the capacity can be specified to estimate the second voltage characteristic, for example by previously performing an experiment.

When the electric storage element is a lithium-ion secondary battery, the variation of the capacity can be a variation excluding a variation of the capacity due to precipitation of lithium. In the lithium-ion secondary battery, both the deterioration due to wear and the deterioration due to precipitation of lithium occur. For specifying the relationship between the capacity retention rate and the variation of the capacity based on the deterioration due to wear, the deterioration due to precipitation of lithium needs to be removed from the actual deterioration state. The deterioration due to precipitation of lithium can be estimated in an actual environment where the lithium-ion secondary battery is used.

According to a second aspect, the present invention provides a method of determining a state of each of a plurality of electric storage blocks connected in serial, each of the electric storage blocks including a plurality of electric storage elements connected in parallel. Each of the electric storage elements includes a current breaker configured to break a current path in the electric storage element. A single electrode capacity retention rate and a variation of a capacity of the electric storage block are defined as mentioned above. As described in the first aspect of the present invention, it is determined that the current breaker is operated when a first voltage characteristic is shifted from a second voltage characteristic. According to the second aspect of the present invention, the same advantages as those in the first aspect can be achieved.

BRIEF DESCRIPTION OF THE DRAWINGS

FIG. 4 is a diagram for generally describing the internal configuration of the cell represented by a battery model.

FIG. 5 is a graph showing the characteristic of changes in open circuit voltage with respect to changes in local SOC.

FIG. 6 is a graph showing a change in diffusion coefficient with respect to a change in battery temperature.

FIG. 7 is a graph showing changes in single electrode open circuit voltage with reductions in single electrode capacity.

MODE FOR CARRYING OUT THE INVENTION

Embodiments of the present invention will hereinafter be described.

Embodiment 1

Figure 1:
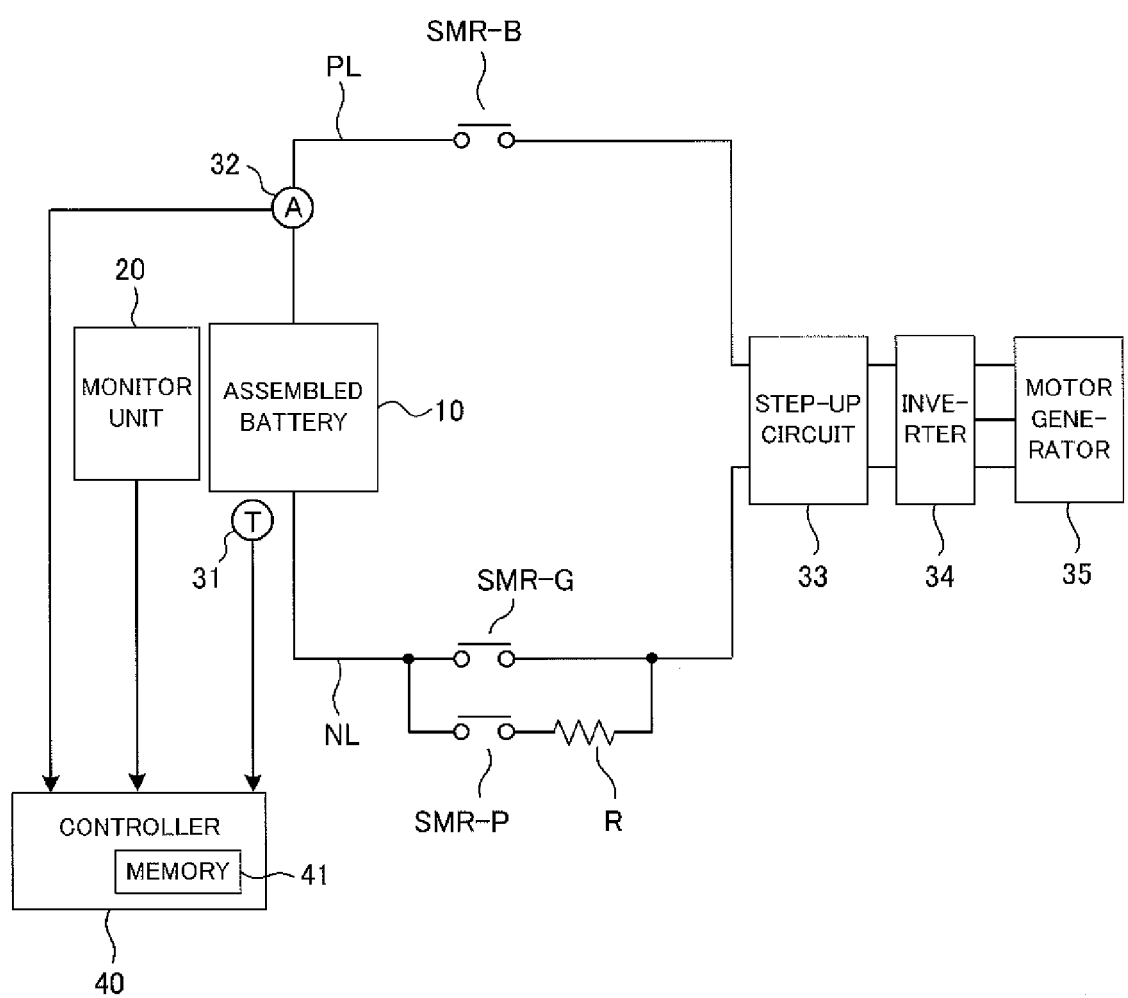
FIG. 1 is a diagram showing the configuration of a battery system.

A battery system (corresponding to an electric storage system according to the present invention) which is Embodiment 1 of the present invention is now described with reference to FIG. 1. FIG. 1 is a diagram showing the configuration of the battery system. The battery system of the present embodiment is mounted on a vehicle.

Examples of the vehicle include a hybrid vehicle and an electric vehicle. The hybrid vehicle includes an internal-combustion engine or a fuel cell in addition to an assembled battery, later described, as the power source for running of the vehicle. The electric vehicle includes only the assembled battery, later described, as the power source for running of the vehicle.

A system main relay SMR-B is provided on a positive electrode line PL connected to a positive electrode terminal of an assembled battery 10. The system main relay SMR-B is switched between ON and OFF in response to a control signal from a controller 40. A system main relay SMR-G is provided on a negative electrode line NL connected to a negative electrode terminal of the assembled battery 10. The system main relay SMR-G is switched between ON and OFF in response to a control signal from the controller 40.

The system main relay SMR-G is connected in parallel to a system main relay SMR-P and a current limiting resistor R. The system main relay SMR-P and the current limiting resistor R are connected in serial. The system main relay SMR-P is switched between ON and OFF in response to a control signal from the controller 40. The current limiting resistor R is used to prevent an inrush current from passing in connecting the assembled battery 10 to a load (specifically, a step-up circuit 33, later described).

In connecting the assembled battery 10 to the load, the controller 40 switches the system main relays SMR-B and SMR-P from OFF to ON. This can pass a current through the current limiting resistor R to prevent the passage of the inrush current. When an ignition switch of the vehicle is switched from OFF to ON, the assembled battery 10 is connected to the load. Information about ON and OFF of the ignition switch is input to the controller 40.

Next, the controller 40 switches the system main relay SMR-G from OFF to ON and then switches the system main relay SMR-P from ON to OFF. This completes the connection between the assembled battery 10 and the load to render the battery system shown in FIG. 1 in a startup state (Ready-On). On the other hand, in breaking the connection between the assembled battery 10 and the load, the controller 40 switches the system main relays SMR-B and SMR-G from ON to OFF. This can stop the operation of the battery system shown in FIG. 1. When the ignition switch is switched from ON to OFF, the connection between the assembled battery 10 and the load is broken.

A monitor unit 20 detects a voltage of the assembled battery 10 (each of battery blocks 11, later described) and outputs the detection result to the controller 40. A temperature sensor 31 detects a temperature of the assembled battery 10 and outputs the detection result to the controller 40. A current sensor 32 detects a value of current passing through the assembled battery 10 and outputs the detection result to the controller 40. For example, during discharge of the assembled battery 10, a positive value can be used as the current value detected by the current sensor 32, and during charge of the assembled battery 10, a negative value can be used as the current value detected by the current sensor 32.

The current sensor 32 is only required to detect the value of the current passing through the assembled battery 10 and may be provided on the negative electrode line NL instead of the positive electrode line PL. A plurality of current sensors 32 may be used. In view of the cost and size, the single current sensor 32 is desirably provided for the single assembled battery 10 as in the present embodiment.

The controller 40 contains a memory 41. The memory 41 stores a program for operating the controller 40 and particular information. The memory 41 may be provided outside the controller 40.

The step-up circuit 33 increases the voltage output from the assembled battery 10 and outputs the power at the increased voltage to an inverter 34. The step-up circuit 33 can reduce a voltage output from the inverter 34 and output the power at the reduced voltage to the assembled battery 10. The step-up circuit 33 is operated in response to a control signal from the controller 40. Although the step-up circuit 33 is used in the battery system of the present embodiment, the step-up circuit 33 may be omitted.

The inverter 34 converts the DC power output from the step-up circuit 33 into an AC power and outputs the AC power to a motor generator 35. The inverter 34 converts an AC power generated by the motor generator 35 into a DC power and outputs the DC power to the step-up circuit 33. For example, a three-phase AC motor can be used as the motor generator 35.

The motor generator 35 receives the AC power from the inverter 34 to generate a kinetic energy for running the vehicle. For running the vehicle with the electric power output from the assembled battery 10, the kinetic energy generated by the motor generator 35 is transferred to wheels.

For decelerating or stopping the vehicle, the motor generator 35 converts a kinetic energy generated in braking of the vehicle into an electric energy (AC power). The inverter 34 converts the AC power produced by the motor generator 35 into a DC power and outputs the DC power to the step-up circuit 33. The step-up circuit 33 outputs the electric power from the inverter 34 to the assembled battery 10. Thus, the assembled battery 10 can accumulate the regenerative electric power.

Figure 2:
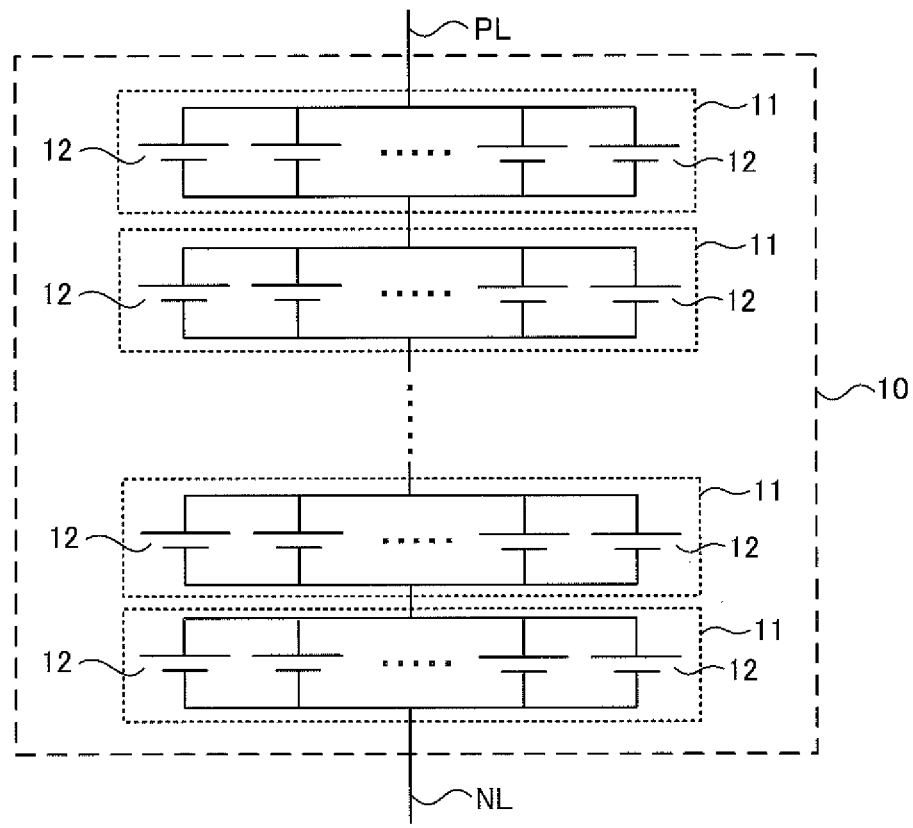
FIG. 2 is a diagram showing the configuration of an assembled battery.

FIG. 2 shows the configuration of the assembled battery 10. The assembled battery 10 includes a plurality of battery blocks (corresponding to electric storage blocks in the present invention) 11 connected in serial. The serial connection of the plurality of battery blocks 11 can ensure the output voltage of the assembled battery 10. The number of the battery blocks 11 can be set as appropriate in view of the voltage required of the assembled battery 10.

Each of the battery blocks 11 has a plurality of cells (corresponding to electric storage elements in the present invention) 12 connected in parallel. The parallel connection of the plurality of cells 12 can increase the full charge capacity of the battery block 11 (assembled battery 10) and extend the distance over which the vehicle is run with the output from the assembled battery 10. The number of the cells 12 constituting each of the battery blocks 11 can be set as appropriate in view of the full charge capacity required of the assembled battery 10 (battery block 11).

Since the plurality of battery blocks 11 are connected in serial, an equal current passes through the battery blocks 11. Since the plurality of cells 12 are connected in parallel in each of the battery blocks 11, the value of current passing through each of the cells 12 is obtained by dividing the value of current passing through the battery block 11 by the total number of the cells 12 constituting the battery block 11. Specifically, assuming that N represents the total number of the cells 12 constituting the battery block 11 and Is represents the value of current passing through the battery block 11, the value of current passing through each of the cells 12 is calculated from Is/N. It is assumed herein that no variations occur in internal resistance among the plurality of cells 12 constituting the battery block 11.

The cell 12 can be provided by using a secondary battery such as a nickel metal hydride battery or a lithium-ion battery. An electric double layer capacitor may be used instead of the secondary battery. For example, a 18650-type cell can be used as the cell 12. The 18650-type cell is of a so-called cylinder-type with a diameter of 18 mm and a length of 65.0 mm. The cylinder-type cell has a cell case of cylindrical shape and a power-generating element capable of charge and discharge housed in the cell case. The configuration of the power-generating element is described later.

Figure 3:
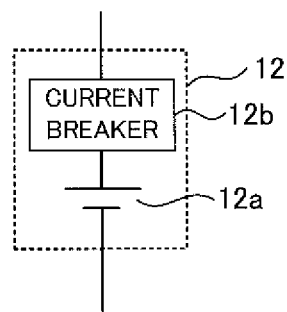
FIG. 3 is a diagram showing the configuration of a cell.

As shown in FIG. 3, the cell 12 has a power-generating element 12a and a current breaker 12b. The power-generating element 12a and the current breaker 12b are housed in a cell case serving as the exterior of the cell 12. The power-generating element 12a is an element responsible for charge and discharge and includes a positive electrode plate, a negative electrode plate, and a separator disposed between the positive electrode plate and the negative electrode plate. The positive electrode plate includes a collector plate and a positive electrode active material layer formed on a surface of the collector plate. The negative electrode plate includes a collector plate and a negative electrode active material layer formed on a surface of the collector plate. The positive electrode active material layer includes a positive electrode active material, a conductive agent and the like. The negative electrode active material layer includes a negative electrode active material, a conductive agent and the like.

When the lithium-ion secondary battery is used as the cell 12, for example, the collector plate of the positive electrode plate can be made of aluminum and the collector plate of the negative electrode plate can be made of copper. $LiCo_{1/3}Ni_{1/3}Mn_{1/3}O_2$ can be used as the positive electrode active material and carbon can be used as the negative electrode active material, by way of example. The separator, the positive electrode active material layer, and the negative electrode active material layer are impregnated with an electrolytic solution. Instead of the separator (containing the electrolytic solution), a solid electrolyte layer may be placed between the positive electrode plate and the negative electrode plate.

The current breaker 12b is used to break a current path within the cell 12. The current breaker 12b can be operated to break the current path within the cell 12. For example, a fuse, a PTC (Positive Temperature Coefficient) element, or a current breaking valve can be used as the current breaker 12b. These current breakers 12b can be used individually or in combination.

The fuse serving as the current breaker 12b may be blown depending on the value of current passing through the fuse. The blown fuse can mechanically break the current path within the cell 12. This can prevent an excessive current from passing through the power-generating element 12a to protect the cell 12 (power-generating element 12a). The fuse serving as the current breaker 12b can be housed in the cell case or can be provided outside the cell case. Even when the fuse is provided outside the cell case, the fuse is provided for each of the cells 12 and is connected in serial to the corresponding cell 12.

The PTC element serving as the current breaker 12b is placed on the current path in the cell 12, and the resistance of the PTC element increases as the temperature of the PTC element rises. As the current passing through the PTC element increases, the temperature of the PTC rises with Joule heat. In response to the temperature rise in the PTC element, the resistance of the PTC element is increased to enable the current to be broken in the PTC element. This can prevent an excessive current from passing through the power-generating element 12a to protect the cell 12 (power-generating element 12a).

The current breaking valve serving as the current breaker 12b can be deformed in response to an increase in internal pressure of the cell 12 to break the mechanical connection to the power-generating element 12a, thereby breaking the current path within the cell 12. The cell 12 is hermetically sealed, and when gas is produced from the power-generating element 12a due to overcharge or the like, the internal pressure of the cell 12 is increased. The cell 12 (power-generating element 12a) is in an abnormal state during the production of the gas from the power-generating element 12a. In response to the increased internal pressure of the cell 12, the current breaking valve can be deformed to break the mechanical connection to the power-generating element 12a. This can prevent a charge or discharge current from passing through the abnormal power-generating element 12a to protect the cell 12 (power-generating element 12a).

When the current breaker 12b is operated in the present embodiment, no current passes through the cell 12 provided with that current breaker 12b. Since the plurality of cells 12 are connected in parallel within the battery block 11, the full charge capacity of the battery block 11 including the current breaker 12b in the operating state becomes lower than the full charge capacity of the battery block 11 which does not include any current breaker 12b in the operating state.

When the current breaker 12b is operated in the battery block 11, the cell 12 provided with that current breaker 12b is separated from the parallel connection to the other cells 12b. This corresponds to a reduction in the number of the cells 12 constituting the battery block 11. The full charge capacity of the battery block 11 depends on the number of the cells 12 constituting the battery block 11. As the number of the cells 12 is reduced, the full charge capacity of the battery block 11 is reduced.

In the present embodiment, the operation of the current breaker 12b is detected by using the difference in capacity between the battery block 11 in which any current breaker 12b is operated and the battery block 11 in which no current breaker 12b is operated. In the following, description is made of a method of detecting the operating state of the current breaker 12b.

A battery model used in the present embodiment is first described. The battery model described below is formed to include a non-linear model to allow dynamic estimation of internal behavior by considering an electrochemical reaction within the secondary battery. The lithium-ion secondary battery is used as the cell 12.

FIG. 4 is a conceptual diagram for generally describing the internal configuration of the cell 12 represented by the battery model.

As shown in FIG. 4, the cell 12 includes a negative electrode 122, a separator 124, and a positive electrode 125. The separator 124 is formed by impregnating the electrolytic solution into a resin provided between the negative electrode 122 and the positive electrode 125.

The negative electrode 122 and the positive electrode 125 are formed of groups of spherical active materials 128n and 128p, respectively. During discharge of the cell 12, a chemical reaction occurs at the interface of the active material 128n of the negative electrode 122 to release lithium ions Li+ and electrons e−. In addition, a chemical reaction occurs at the interface of the active material 128p of the positive electrode 125 to absorb lithium ions Li+ and electrons e−. During charge of the cell 12, reactions reverse to those described above occur in terms of release and absorption of electrons e−.

The negative electrode 122 is provided with a current collector 123 for absorbing the electrons e−, and the positive electrode 125 is provided with a current collector 126 for releasing the electrons e−. The current collector 123 for the negative electrode is typically made of copper, and the current collector 126 for the positive electrode is typically made of aluminum. The current collector 123 is provided with a negative electrode terminal, and the current collector 126 is provided with a positive electrode terminal. The lithium ions Li+ are passed through the separator 124 to achieve charge or discharge of the cell 12 to produce a charge current or a discharge current.

The charge and discharge states within the cell 12 depend on lithium concentration distributions in the active materials 128n and 128p of the electrode (negative electrode 122 and positive electrode 125). The lithium corresponds to a substance involved in the reaction in the lithium-ion secondary battery.

The sum of a purely electrical resistance (pure resistance) Rd to the movement of the electrons e− and a charge transfer resistance (reaction resistance) Rr equivalently acting as an electrical resistance when a reaction current occurs at the interface of the active material in the negative electrode 122 and the positive electrode 125 corresponds to a DC resistance when the cell 12 is seen from a macroscopic viewpoint. The macroscopic DC resistance is also referred to as a DC resistance Ra in the following description. The diffusion of the lithium Li within the active materials 128n and 128p is governed by a diffusion coefficient Ds.

In expressions for the battery model described herein, the battery model is constructed with the influence of the electric double layer capacity ignored since the influence at room temperature is small. The battery model is defined as a model per unit electrode plate area of the electrode. The use of the model per unit electrode plate area of the electrode allows the generalization of the model for a design capacity.

For a battery voltage V corresponding to the output voltage of the cell 12, the following expression (1) holds in which a battery temperature T, a battery current I, an open circuit voltage OCV, and the macroscopic DC resistance Ra of the overall cell 12 are used. The battery current I represents the value of current per unit electrode plate area. Specifically, the battery current I is defined as I=Ib/S where Ib represents the battery current (current value measurable by the current sensor 32) passing through the positive electrode terminal and the negative electrode terminal, and S represents the area of both surfaces of the electrode plate. In the following, the current described in the battery model refers to the current per unit electrode plate area unless otherwise specified.

$$V = OCV(\theta_1, \theta_2) - R_a(\theta_1, \theta_2, T) \times I \quad (1)$$
$$= U_1(\theta_1) - U_2(\theta_2) - R_a(\theta_1, \theta_2, T) \times I$$

$\theta_1$ and $\theta_2$ represent a local SOC at the surface of the positive electrode active material and a local SOC at the surface of the negative electrode active material, respectively. The open circuit voltage OCV is represented by a potential difference between a positive electrode open circuit potential $U_1$ and a negative electrode open circuit potential $U_2$. As shown in FIG. 5, the positive electrode open circuit potential $U_1$ and the negative electrode open circuit potential $U_2$ have the characteristics of changing depending on the local SOC $\theta_1$ and the local SOC $\theta_2$, respectively. In an initial state of the cell 12, the relationship between the local SOC$\theta_1$ and the positive electrode open circuit potential $U_1$ and the relationship between the local SOC$\theta_2$ and the negative electrode open circuit potential $U_2$ can be previously measured. This can provide a characteristic map which previously stores the change characteristic of the positive electrode open circuit potential $U_1$ ($\theta_1$) with respect to a change in the local SOC$\theta_1$ and the change characteristic of the negative electrode open circuit potential $U_2$ ($\theta_2$) with respect to a change in the local SOC$\theta_2$.

The DC resistance Ra has the characteristic of changing depending on the changes of the local SOC$\theta_1$, the local SOC$\theta_2$, and the battery temperature T. In other words, the DC resistance Ra is represented as a function of the local SOCs ($\theta_1$ and $\theta_2$) and the battery temperature T. Thus, the result of an experiment using the cell 12 in the initial state can be used to form a characteristic map (DC resistance map) for determining the value of the DC resistance Ra associated with a combination of the local SOCs ($\theta_1$ and $\theta_2$) and the battery temperature T.

In the spherical active material model of each of the negative electrode 122 and the positive electrode 125, a local SOC$\theta_i$ (i=1, 2) at the surface (the interface with the electrolytic solution) of the active material is defined by the following expression (2). Similarly to the local SOC$\theta_i$, it is assumed that 1 and 2 used for the subscript i represent the positive electrode and the negative electrode, respectively, in the following description.

$$\theta_i = \frac{c_{se,i}}{c_{s,i,max}} \quad (i = 1,2) \quad (2)$$

In the expression (2), $C_{se,i}$ represents a lithium average concentration at the interface of the active material, and $C_{s,i,max}$ represents a maximum lithium concentration within the active material. According to the expression (2), the local SOC$\theta_i$ (i=1, 2) can be calculated on the basis of the lithium average concentration $C_{se,i}$. The characteristic map shown in FIG. 5 can be used to specify the open circuit potentials $U_1$ ($\theta_1$) and $U_2$ ($\theta_2$) associated with the local SOC$\theta_i$ (i=1, 2). Once the potential difference between the open circuit potential $U_1$ ($\theta_1$) and the open circuit potential $U_2$ ($\theta_2$) is calculated, the Open Circuit Voltage (estimated value) of the cell 12 can be determined.

The lithium concentration $C_{s,i}$ has a distribution in a radius direction within the active material handled in the spherical model. Specifically, the lithium concentration distribution within the active material assumed to be spherical is determined by a diffusion equation in a polar coordinate system shown in the following expression (3).

$$\frac{\partial c_{s,i}}{\partial t} = D_{s,i}(T)\left[\frac{\partial^2 c_{s,i}}{\partial r} + \frac{2}{r}\frac{\partial c_{s,i}}{\partial r}\right] (i = 1,2). \quad (3)$$

In the expression (3), $D_{s,i}$ represents the diffusion coefficient of lithium in the active material. As shown in FIG. 6, the diffusion coefficient $D_{s,i}$ has the characteristic of changing depending on the battery temperature T. For the diffusion coefficient $D_{s,i}$ a characteristic map (diffusion coefficient map) can be formed which previously stores the change characteristic of the diffusion coefficient $D_{s,i}$(T) with respect to a change in the battery temperature T based on the result of an experiment using the cell 12 in the initial state, similarly to the DC resistance Ra.

A boundary condition in the diffusion equation of the expression (3) is set as the following expressions (4) and (5).

$$\frac{\partial c_{s,i}}{\partial r} = 0 \ (r = 0, i = 1,2) \quad (4)$$

$$\frac{\partial c_{s,i}}{\partial t} = \frac{\partial c_{se,i}}{\partial t} = -\frac{j_1}{\varepsilon_{s,i} a_{s,i} F} \ (r = r_{s,i}, i = 1,2) \quad (5)$$

The expression (4) indicates that a concentration gradient at the center of the active material is zero. The expression (5) means that the lithium concentration at the interface between the active material and the electrolytic solution is changed in association with the movement of the lithium through the surface of the active material.

In the expression (5), $r_{s,i}$ represents the radius of the active material, and $\varepsilon_{s,1}$ represents the volume fraction of the active material, and $a_{s,i}$ represents the surface area of the active material per unit volume of the electrode. These values are determined from the result of measurement with various electrochemical measurement techniques. F represents the Faraday's constant.

In the expression (5), j represents the amount of produced lithium per unit volume and time. For simplifying the description, assuming that the reaction uniformly occurs in a thickness direction of the electrode, the following expression (6) is given where $L_i$ represents a thickness of the electrode and I represents the battery current per unit electrode plate area.

$$I = -j_1 L_1 = j_2 L_2 \quad (6)$$

Once the expressions (1) to (6) are solved simultaneously by using the battery current I and the battery voltage V as inputs, the internal state of the cell 12 is estimated to allow the estimation of a charge rate while an estimated voltage value and an estimated current value are calculated.

The open circuit voltage OCV of the cell 12 has the characteristic of decreasing as the discharge proceeds. In general, the deteriorated cell 12 experiences a larger voltage reduction than that of the cell 12 in the initial state for the same discharge time. This means that the deterioration of the cell 12 reduces the full charge capacity and changes the open circuit voltage characteristic. In the present embodiment, the change in the open circuit voltage characteristic due to the deterioration of the cell 12 is modeled as two phenomena presumably occurring within the deteriorated cell 12. In this case, the deterioration of the cell 12 includes wear of materials forming the cell 12 over time, and this is referred to as wear deterioration.

The two phenomena are a reduction in single electrode capacity in the positive electrode and the negative electrode and a composition correspondence mismatch between the positive electrode and the negative electrode. The reduction in single electrode capacity represents a reduction in ability to receive lithium ions in each of the positive electrode and the negative electrode. The reduction in ability to receive lithium ions means a reduction in the active materials and the like effectively functioning in charge and discharge.

FIG. 7 shows a positive electrode open circuit potential $U_{11}$ and a negative electrode open circuit potential $U_{21}$ when the cell 12 is in the initial state (not deteriorated) and a positive electrode open circuit potential $U_{11}$ and a negative electrode open circuit potential $U_{21}$ when the cell 12 is in the deteriorated state. FIG. 7 schematically shows changes in single electrode open circuit potential due to the reduction in single electrode capacity.

In FIG. 7, Q_L1 on the axis of the positive electrode capacity indicates a capacity associated with a local $SOC\theta_{L1}$ in FIG. 5 in the initial state of the cell 12, and Q_H11 indicates a capacity associated with a local $SOC\theta_{H1}$ in FIG. 5 in the initial state of the cell 12. Q_L2 on the axis of the negative electrode capacity indicates a capacity associated with a local $SOC\theta_{L2}$ in FIG. 5 in the initial state of the cell 12, and Q_H21 indicates a capacity associated with a local $SOC\theta_{H2}$ in FIG. 5 in the initial state of the cell 12.

When the ability to receive lithium ions is reduced in the positive electrode, the capacity associated with the local $SOC\theta_1$ is changed from Q_H11 to Q_H12. When the ability to receive lithium ions is reduced in the negative electrode, the capacity associated with the local $SOC\theta_2$ is changed from Q_H21 to Q_H22.

Even when the cell 12 is deteriorated, the relationship (the relationship shown in FIG. 5) between the local $SOC\theta_1$ and the positive electrode open circuit potential $U_1$ is not changed. When the relationship between the local $SOC\theta_1$ and the positive electrode open circuit potential $U_1$ is converted into the relationship between the positive electrode capacity and the positive electrode open circuit potential, the curve representing the relationship between the positive electrode capacity and the positive electrode open circuit potential is shortened from the curve representing the initial state by the deterioration of the cell 12 as shown in FIG. 7.

When the relationship between the local $SOC\theta_2$ and the negative electrode open circuit potential $U_2$ is converted into the relationship between the negative electrode capacity and the negative electrode open circuit potential, the curve representing the relationship between the negative electrode capacity and the negative electrode open circuit potential is shortened from the curve representing the initial state by the deterioration of the cell 12 as shown in FIG. 7.

Figure 8:
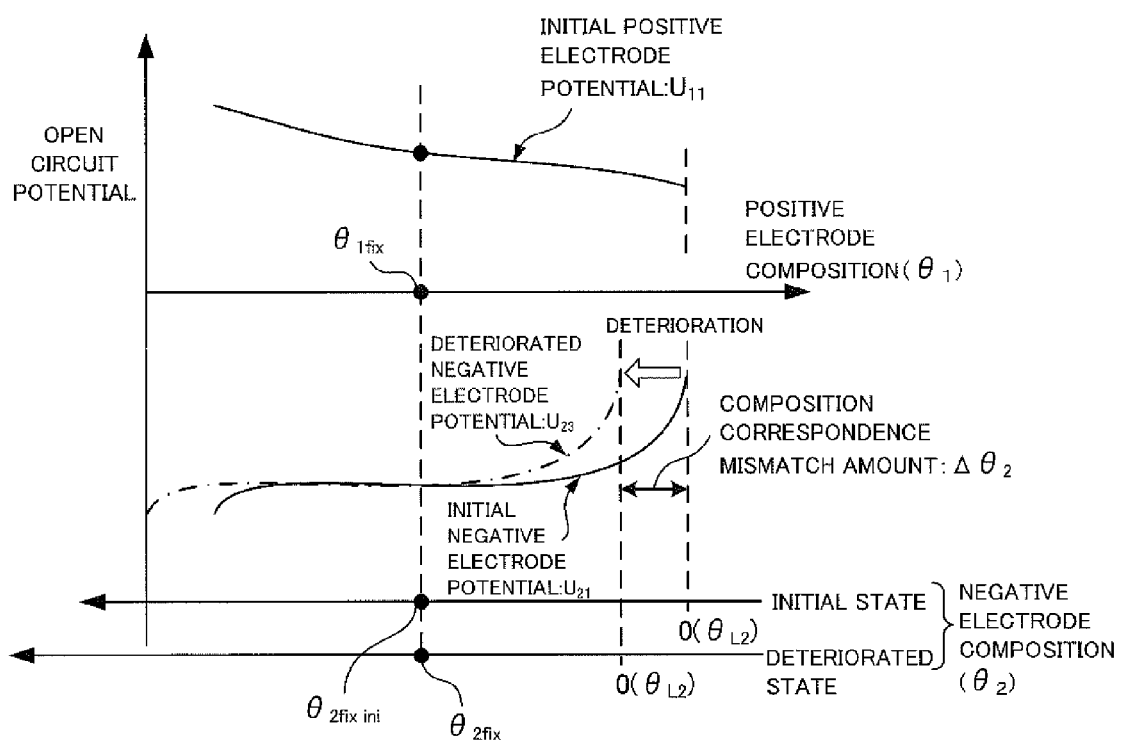
FIG. 8 is a graph for describing a composition correspondence mismatch between a positive electrode and a negative electrode.

FIG. 8 schematically shows the composition correspondence mismatch between the positive electrode and the negative electrode. The composition correspondence mismatch means a mismatch between the combination of a composition ($\theta_1$) of the positive electrode and a composition ($\theta_2$) of the negative electrode in the initial state of the cell 12 and the combination after the charge and discharge are performed using the set of the positive electrode and the negative electrode.

Each of the curves representing the relationships between the compositions $\theta_1$ and $\theta_2$ of the single electrodes and the open circuit potentials $U_1$ and $U_2$ is similar to that shown in FIG. 5. When the cell 12 is deteriorated, the axis of the negative electrode composition $\theta_2$ is shifted by $\Delta\theta_2$ to a lower positive electrode composition $\theta_1$. This causes the curve representing the relationship between the negative electrode composition $\theta_2$ and the negative electrode open circuit potential $U_2$ to be shifted by $\Delta\theta_2$ to a lower positive electrode composition $\theta_1$ relative to the curve representing the initial state.

The composition of the negative electrode corresponding to a composition $\theta_{1fix}$ of the positive electrode is "$\theta_{2fix\_ini}$" in the initial state of the cell 12, and is "$\theta_{2fix}$" after the deterioration of the cell 12. In FIG. 8, a negative electrode composition $\theta_{L2}$ shown in FIG. 5 is set at zero, and this indicates a state in which all the lithium ions in the negative electrode are eliminated.

In the present embodiment, three deterioration parameters are introduced in the battery model to model the two deterioration phenomena described above. The three deterioration parameters include a positive electrode capacity retention rate (also referred as a single electrode capacity retention rate), a negative electrode capacity retention rate (also referred to as a single electrode capacity retention rate), and a composition correspondence mismatch amount. A method of modeling the two deterioration phenomena is described in the following.

The positive electrode capacity retention rate refers to the ratio of the positive electrode capacity in the deteriorated state to the positive electrode capacity in the initial state. It is assumed that, when the cell 12 is deteriorated, the positive electrode capacity is reduced by an arbitrary amount from the capacity in the initial state. The positive electrode capacity retention rate $k_1$ is represented by the following expression (7).

$$k_1 = \frac{Q_{1\_ini} - \Delta Q_1}{Q_{1\_ini}} \quad (7)$$

$$(0 < k_1 < 1)$$

$Q_{1\_ini}$ represents the positive electrode capacity (Q_H11 shown in FIG. 7) when the cell 12 is in the initial state, $\Delta Q_1$ represents the amount of reduction in positive electrode capacity after the cell 12 is deteriorated. The positive electrode capacity $Q_{1\_ini}$ can be previously determined from the theoretical capacity and the provided amount of the active material and the like.

The negative electrode capacity retention rate refers to the ratio of the negative electrode capacity in the deteriorated state to the negative electrode capacity in the initial state. It is assumed that, when the cell 12 is deteriorated, the negative electrode capacity is reduced by an arbitrary amount from the capacity in the initial state. The negative electrode capacity retention rate $k_2$ is represented by the following expression (8).

$$k_2 = \frac{Q_{2\_ini} - \Delta Q_2}{Q_{2\_ini}} \quad (8)$$

$$(0 < k_2 < 1)$$

$Q_{2\_ini}$ represents the negative electrode capacity (Q_H21 shown in FIG. 7) when the cell 12 is in the initial state, $\Delta Q_2$ represents the amount of reduction in negative electrode capacity after the cell 12 is deteriorated. The negative electrode capacity $Q_{2\_ini}$ can be previously determined from the theoretical capacity and the provided amount of the active material and the like.

Figure 9:
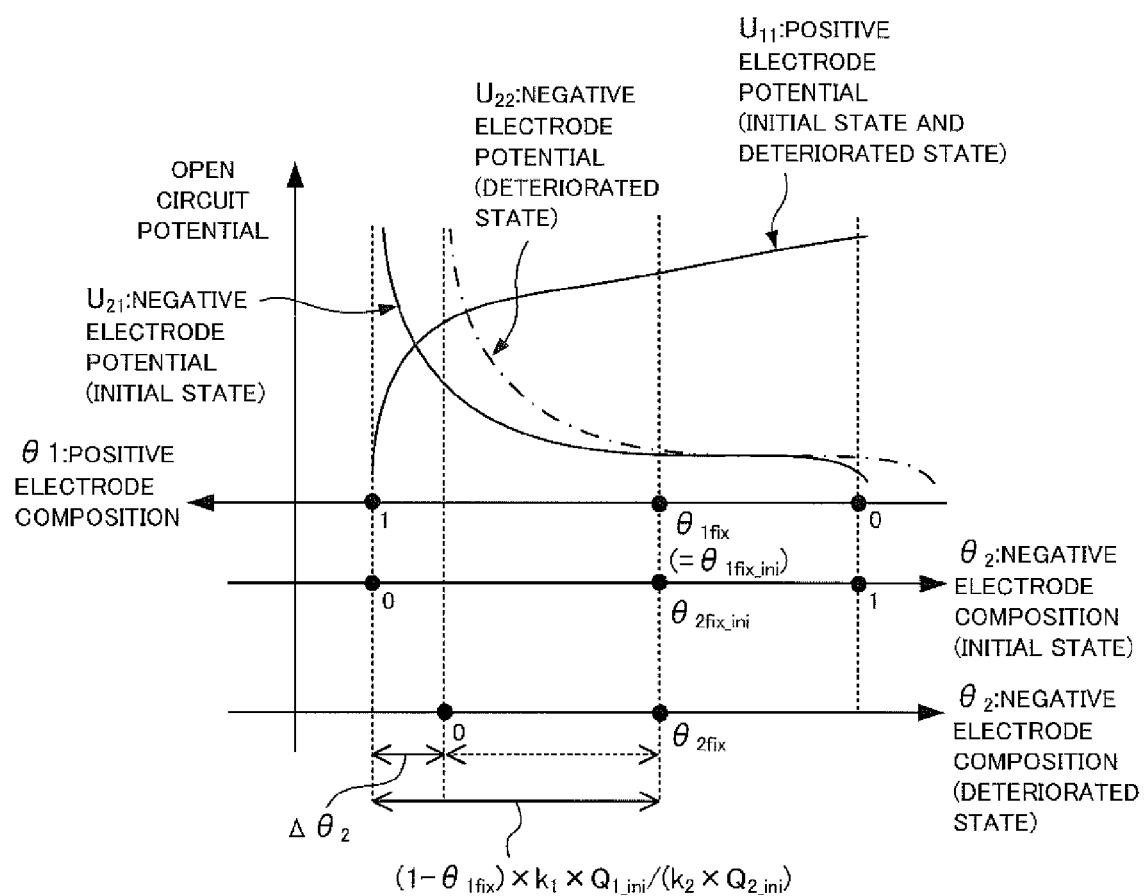
FIG. 9 is a graph for describing the composition correspondence mismatch due to deterioration.

FIG. 9 is a schematic diagram for explaining the composition correspondence mismatch between the positive electrode and the negative electrode.

Once the cell 12 is deteriorated, the capacity at a negative electrode composition $\theta_2$ of 1 is represented as $(Q_{2\_ini} - \Delta Q_2)$. A composition correspondence mismatch capacity $\Delta Q_S$ between the positive electrode and the negative electrode is a capacity corresponding to a mismatch amount $\Delta\theta_2$ of the negative electrode composition axis relative to the positive electrode composition axis. Thus, the relationship shown in the following expression (9) holds.

$$1 : \Delta\theta_2 = (Q_{2\_ini} - \Delta Q_2) : \Delta Q_s \tag{9}$$

The following expression (10) is derived from the expression (8) and the expression (9).

$$\begin{aligned}\Delta Q_s &= (Q_{2\_ini} - \Delta Q_2) \times \Delta\theta_2 \\ &= k_2 \times Q_{2\_ini} \times \Delta\theta_2\end{aligned} \tag{10}$$

When the cell 12 is in the initial state, a positive electrode composition $\theta_{1fix\_ini}$ corresponds to a negative electrode composition $\theta_{2fix\_ini}$. When the cell 12 is in the deteriorated state, a positive electrode composition $\theta_{1fix}$ corresponds to a negative electrode composition $\theta_{2fix}$. The composition correspondence mismatch is determined by using the positive electrode composition $\theta_{1fix}$ in the initial state as the reference. Thus, the positive electrode composition $\theta_{1fix}$ and the positive electrode composition $\theta_{1fix\_ini}$ have the same value.

When the deterioration of the cell 12 produces the composition correspondence mismatch between the positive electrode and the negative electrode, the positive electrode composition $\theta_{1fix}$ and the negative electrode composition $\theta_{2fix}$ after the deterioration of the cell 12 have the relationship represented by the following expressions (11) and (12).

$$\theta_{1fix} = \theta_{1fix\_ini} \tag{11}$$

$$\theta_{2fix} = \frac{(1 - \theta_{1fix}) \times k_1 \times Q_{1\_ini} - \Delta Q_s}{k_2 \times Q_{2\_ini}} \tag{12}$$

Description is now made of the meaning of the expression (12). When the positive electrode composition $\theta_1$ is changed (reduced) from 1 to $\theta_{1fix}$ due to the deterioration of the cell 12, the amount A of the lithium ions released from the positive electrode is represented by the following expression (13).

$$A = (1 - \theta_{1fix}) \times k_1 \times Q_{1\_ini} \tag{13}$$

In the expression (13), the value of $(1-\theta_{1fix})$ indicates the change in positive electrode composition due to the deterioration of the cell 12. The value of $(k_1 \times Q_{1\_ini})$ indicates the positive electrode capacity after the deterioration of the cell 12.

Assuming that all the lithium ions released from the positive electrode are taken into the negative electrode, the negative electrode composition $\theta_{2fix}$ is represented by the following expression (14).

$$\theta_{2fix} = \frac{(1 - \theta_{1fix}) \times k_1 \times Q_{1\_ini}}{k_2 \times Q_{2\_ini}} \tag{14}$$

In the expression (14), the value of $(k_2 \times Q_{2\_ini})$ indicates the negative electrode capacity after the deterioration of the cell 12.

When the composition correspondence mismatch ($\Delta\theta_2$) between the positive electrode and the negative electrode exists, the negative electrode composition $\theta_{2fix}$ is represented by the following expression (15).

$$\theta_{2fix} = \frac{(1 - \theta_{1fix}) \times k_1 \times Q_{1\_ini}}{k_2 \times Q_{2\_ini}} - \Delta\theta_2 \tag{15}$$

As shown in the expression (10), the composition correspondence mismatch amount $\Delta\theta_2$ can be represented with the composition correspondence mismatch capacity $\Delta Q_S$. Thus, the negative electrode composition $\theta_{2fix}$ is represented by the above expression (12).

In the battery model of the present embodiment, the reduction in single electrode capacity is reflected on the electrode thickness and the active material volume fraction as shown in the following expressions (16) to (19).

$$L_1 = L_{10} \times \sqrt{k_1} \tag{16}$$

$$L_2 = L_{20} \times \sqrt{k_2} \tag{17}$$

$$\epsilon_{s,1} = \epsilon_{s0,1} \times \sqrt{k_1} \tag{18}$$

$$\epsilon_{s,2} = \epsilon_{s0,2} \times \sqrt{k_2} \tag{19}$$

$L_{10}$ and $L_{20}$ represent the thickness of the positive electrode and the thickness of the negative electrode in the initial state, respectively, and $\epsilon_{s0,1}$ and $\epsilon_{s0,2}$ represent the volume fraction of the positive electrode active material and the volume fraction of the negative electrode active material in the initial state, respectively.

The open circuit voltage OCV is calculated by the following expression (20) when the deterioration reduces the capacity of the single electrode (positive electrode or negative electrode) and causes the relative composition correspondence mismatch between the positive electrode and the negative electrode. Since a salt concentration distribution exists within the active material while a current passes through the cell 12 or immediately after charge or discharge of the cell 12 is stopped, the salt concentration at the surface of the active material does not coincide with the average salt concentration within the active material. In determining the open circuit voltage OCV, the cell 12 is in a sufficiently relaxed state and no salt concentration distribution exists within the active material. The salt concentration at the surface of the active material is identical to the average salt concentration within the active material.

$$OCV(\theta_{1ave}, \theta_{2ave}) = U(\theta_{1ave}) - U(\theta_{2ave}) \tag{20}$$

In the expression (20), $\theta_{1ave}$ and $\theta_{2ave}$ represent average charge rates within the active material in the positive electrode and the negative electrode, respectively, and are defined by the following expression (21). In the following expression (21), $c_{save,i}$ represents the average salt concentration within the active material.

$$\theta_{iave} = \frac{c_{save,i}}{c_{s,i,max}} \quad (i = 1, 2) \tag{21}$$

The relationship shown by the following expression (22) holds between $\theta_{1ave}$ and $\theta_{2ave}$.

$$\theta_{2ave} = \theta_{2fix} + (\theta_{1fix} - \theta_{1ave}) \times \lambda \tag{22}$$

λ shown in the above expression (22) is defined by the following expression (23).

$$\lambda = \frac{c_{s,1,max} L_1 \varepsilon_{s,1}}{c_{s,2,max} L_2 \varepsilon_{s,2}} \quad (23)$$

Figure 10:
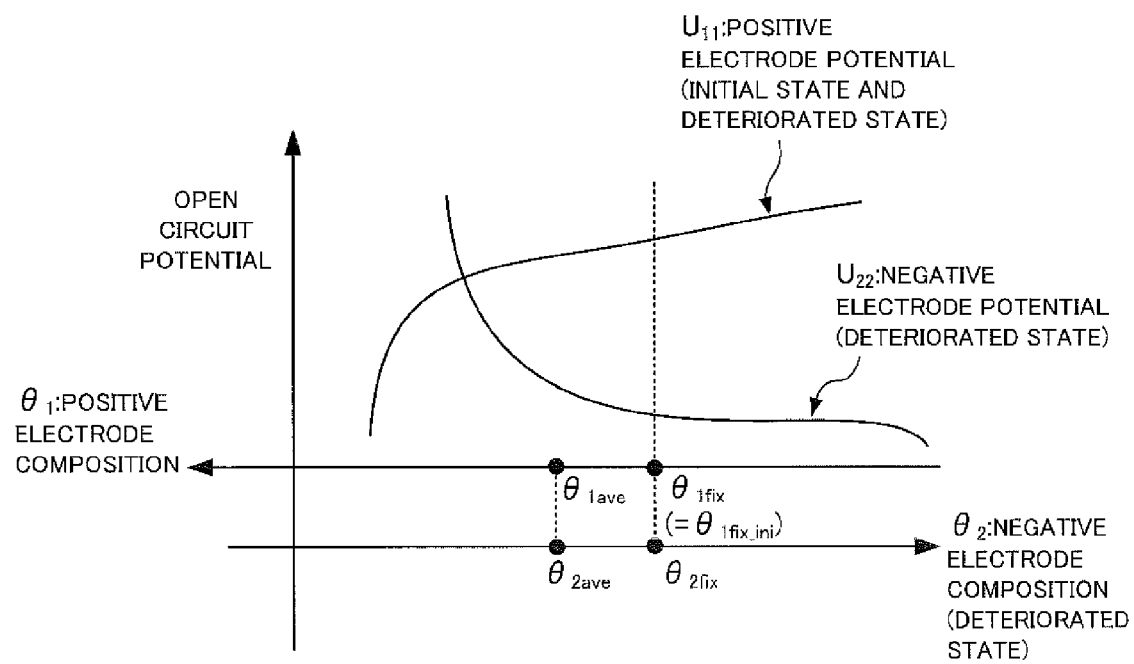
FIG. 10 is a graph for describing a relational expression holding between an average charge rate within a positive electrode active material and an average charge rate within a negative electrode active material.

FIG. 10 is a graph for explaining a relational expression holding between an average charge rate $\theta_{1ave}$ within the positive electrode active material and an average charge rate $\theta_{2ave}$ within the negative electrode active material. In FIG. 10, it is assumed that a positive electrode composition $\theta_{1fix}$ corresponds to a negative electrode composition $\theta_{2fix}$. It is also assumed that all the lithium ions released from the negative electrode are absorbed by the positive electrode to change the negative electrode composition from $\theta_{2fix}$ to $\theta_{2ave}$ and to change the positive electrode composition from $\theta_{1fix}$ to $\theta_{1ave}$.

Since the lithium change amount in the positive electrode is equal to the lithium change amount in the negative electrode, the relationship of the following expression (24) holds from the above expressions (16) to (19) and the above expression (21) where S represents the electrode plate area of the positive electrode and the negative electrode.

$$(\theta_{1fix} - \theta_{1ave}) \times c_{s,1,max} \times L_1 \times \varepsilon_{s,1} \times S = \\ (\theta_{2ave} - \theta_{2fix}) \times c_{s,2,max} \times L_2 \times \varepsilon_{s,2} \times S \quad (24)$$

The above expression (24) is solved to give the above expressions (22) and (23).

As described above, the average charge rate $\theta_{1ave}$ within the positive electrode active material and the average charge rate $\theta_{2ave}$ within the negative electrode active material can be calculated to calculate the OCV change characteristic observed when the deterioration reduces the single electrode capacity and causes the composition correspondence mismatch between the positive electrode and the negative electrode with the above expression (20). As shown in the above expression (22), $\theta_{1ave}$ and $\theta_{2ave}$ are associated with the positive electrode composition $\theta_{1fix}$ and the negative electrode composition $\theta_{2fix}$.

As shown in the expression (14), the negative electrode composition $\theta_{2fix}$ involves the positive electrode capacity retention rate $k_1$, the negative electrode capacity retention rate $k_2$, and the composition correspondence mismatch capacity $\Delta Q_S$. Thus, the positive electrode capacity retention rate $k_1$, the negative electrode capacity retention rate $k_2$, and the composition correspondence mismatch capacity $\Delta Q_S$ are estimated to allow the estimation of $\theta_{1ave}$ and $\theta_{2ave}$ after the deterioration of the cell 12. This, in turn, allows the estimation of the OCV change characteristic of the cell 12 depending on the deterioration of the cell 12.

Figure 11:
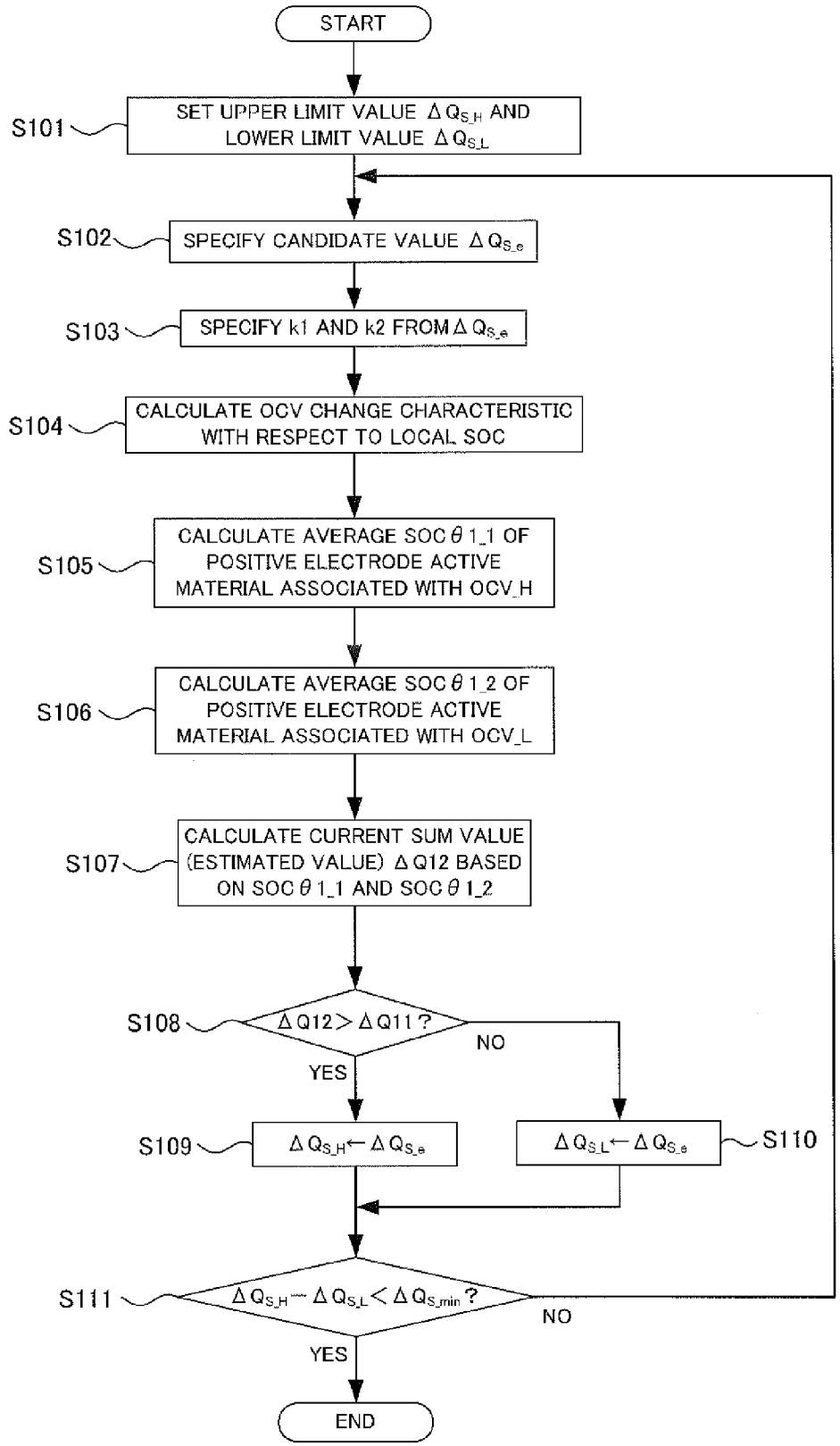
FIG. 11 is a flow chart showing the processing of finding deterioration parameters.

FIG. 11 is a flow chart showing the processing of estimating (finding) the deterioration parameters. The processing shown in FIG. 11 is performed by the controller 40.

First, at step S101, the controller 40 sets an upper limit value $\Delta Q_{S\_H}$ and a lower limit value $\Delta Q_{S\_L}$ of the composition correspondence mismatch capacity $\Delta Q_S$ in order to calculate the optimal composition correspondence mismatch capacity $\Delta Q_S$. When the processing of finding the composition correspondence mismatch capacity $\Delta Q_S$ is performed for the first time, the upper limit value $\Delta Q_{S\_H}$ and the lower limit value $\Delta Q_{S\_L}$ are set at predetermined values.

At step S102, the controller 40 specifies a candidate value $\Delta Q_{S\_e}$ for the composition correspondence mismatch capacity $\Delta Q_S$ falling within the range between the upper limit value $\Delta Q_{S\_H}$ and the lower limit value $\Delta Q_{S\_L}$. For example, the controller 40 specifies an intermediate value between the upper limit value $\Delta Q_{S\_H}$ and the lower limit value $\Delta Q_{S\_L}$ as the candidate value $\Delta Q_{S\_e}$.

At step S103, the controller 40 specifies the positive electrode capacity retention rate $k_1$ and the negative electrode capacity retention rate $k_2$ from the candidate value $\Delta Q_{S\_e}$ for the present composition correspondence mismatch capacity $\Delta Q_S$. By previously providing a map indicating the relationship between the composition correspondence mismatch capacity $\Delta Q_S$ and the single electrode capacity retention rates $k_1$ and $k_2$ by an experiment or the like, the single electrode capacity retention rates $k_1$ and $k_2$ associated with the candidate value $\Delta Q_{S\_e}$ can be specified. The positive electrode capacity retention rate $k_1$ can be calculated from the composition correspondence mismatch capacity $\Delta Q_S$ through the use of a function which includes the composition correspondence mismatch capacity $\Delta Q_S$ and the positive electrode capacity retention rate $k_1$ as variables. The negative electrode capacity retention rate $k_2$ can be calculated from the composition correspondence mismatch capacity $\Delta Q_S$ through the use of a function which includes the composition correspondence mismatch capacity $\Delta Q_S$ and the negative electrode capacity retention rate $k_2$ as variables.

At step S104, the controller 40 calculates the OCV change characteristic with respect to the local $SOC\theta_i$ (corresponding to a second voltage characteristic in the present invention) based on the composition correspondence mismatch capacity $\Delta Q_S$ and the single electrode capacity retention rates $k_1$ and $k_2$ specified at steps S102 and S103.

At step S105, the controller 40 uses the OCV change characteristic calculated at step S104 and an open circuit voltage $OCV\_H$ at the start of current summing processing to calculate the average charge rate (average $SOC\theta_{1\_1}$) within the positive electrode active material associated with the open circuit voltage $OCV\_H$.

At step S106, the controller 40 uses the OCV change characteristic calculated at step S104 and an open circuit voltage $OCV\_L$ at the end of the current summing processing to calculate the average charge rate (average $SOC\theta_{1\_2}$) within the positive electrode active material associated with the open circuit voltage $OCV\_L$. The open circuit voltage $OCV\_H$ is higher than the open circuit voltage $OCV\_L$. The assembled battery 10 (battery block 11) is discharged when the processing of finding the deterioration parameters is performed.

At step S107, the controller 40 calculates (estimates) a sum value $\Delta Q_{12}$ of battery currents which should pass during the change in open circuit voltage from $OCV\_H$ to $OCV\_L$ on the battery model based on the average $SOC\theta_{1\_1}$ and the average $SOC\theta_{1\_2}$ calculated at steps S105 and S106. Specifically, the controller 40 calculates the current sum value (estimated value) $\Delta Q_{12}$ with the following expression (25). In the following expression (25), S represents the area of the electrode plate.

$$\Delta Q_{12} = (\theta_{1\_2} - \theta_{1\_1}) C_{S,1,max} L_1 \varepsilon_{s,1} F S \quad (25)$$

At step 108, the controller 40 compares the current sum value (estimated value) $\Delta Q_{12}$ with a current sum value (actually measured value) $\Delta Q_{11}$. The current sum value (actually measured value) $\Delta Q_{11}$ is a value provided by summing current values detected by the current sensor 32 during the change in open circuit voltage from $OCV\_H$ to $OCV\_L$. The current value detected by the current sensor 32 during discharge of the assembled battery 10 is set at a positive value, and the current value detected by the current sensor 32 during charge of the assembled battery 10 is set at a negative value.

When the current sum value (estimated value) $\Delta Q_{12}$ is larger than the current sum value (actually measured value) $\Delta Q_{11}$, processing at step S109 is performed. When the current sum value (estimated value) $\Delta Q_{12}$ is smaller than the current sum value (actually measured value) $\Delta Q_{11}$, processing at step S110 is performed.

At step S109, the controller 40 replaces the upper limit value $\Delta Q_{S\_H}$ to be used in the next calculation of the composition correspondence mismatch capacity $\Delta Q_S$ with the present candidate value $\Delta Q_{S\_e}$ for the composition correspondence mismatch capacity. This sets the candidate value $\Delta Q_{S\_e}$ within the range from $\Delta Q_{S\_L}$ to $\Delta Q_{S\_e}$ in the next finding processing.

At step S110, the controller 40 replaces the lower limit value $\Delta Q_{S\_L}$ to be used in the next calculation of the composition correspondence mismatch capacity $\Delta Q_S$ with the present candidate value $\Delta Q_{S\_e}$ for the composition correspondence mismatch capacity. This sets the candidate value $\Delta Q_{S\_e}$ within the range from $\Delta Q_{S\_e}$ to $\Delta Q_{S\_H}$ in the next finding processing.

At step S11, the controller 40 determines whether or not the difference ($\Delta Q_{S\_H} - \Delta Q_{S\_L}$) between the upper limit value $\Delta Q_{S\_H}$ and the lower limit value $\Delta Q_{S\_L}$ is smaller than a predetermined value $\Delta Q_{S\_min}$. When the difference ($\Delta Q_{S\_H} - \Delta Q_{S\_L}$) is smaller than the predetermined value $\Delta Q_{S\_min}$, the processing shown in FIG. 11 is ended. When the difference ($\Delta Q_{S\_H} - \Delta Q_{S\_L}$) is larger than the predetermined value $\Delta Q_{S\_min}$, the controller 40 returns to the processing at step S102.

The processing shown in FIG. 11 is repeated until the difference ($\Delta Q_{S\_H} - \Delta Q_{S\_L}$) becomes smaller than the predetermined value $\Delta Q_{S\_min}$, so that the composition correspondence mismatch capacity $\Delta Q_S$ is estimated such that the difference (estimation error) between the current sum value (estimated value) $\Delta Q_{12}$ and the current sum value (actually measured value) $\Delta Q_{11}$ is the minimum. In other words, the composition correspondence mismatch capacity $\Delta Q_S$ is estimated such that the estimation error involved in the OCV change (change from $OCV\_H$ to $OCV\_L$) is the minimum (for example, zero).

The processing can calculate the optimal deterioration parameters (composition correspondence mismatch capacity $\Delta Q_S$, the positive electrode capacity retention rate $k_1$, and the negative electrode capacity retention rate $k_2$) for the calculated open circuit voltages $OCV\_H$ and $OCV\_L$, and the current sum value (actually measured value) $\Delta Q_{11}$. Once the optimal deterioration parameters are calculated, the OCV change characteristic associated with the deterioration parameters can be estimated on the battery model.

It is assumed that an open circuit voltage $OCV\_M$ (corresponding to a second voltage in the present invention) is located between the open circuit voltage $OCV\_H$ (corresponding to a first voltage in the present invention) and the open circuit voltage $OCV\_L$ (corresponding to a third voltage in the present invention). For the current sum value between $OCV\_H$ and $OCV\_M$, a current sum value (actually measured value) $\Delta Q_{21}$ coincides with a current sum value (estimated value) $\Delta Q_{22}$ or the error between them falls within an allowable range when only deterioration as expected occurs. The deterioration as expected means a change in open circuit voltage along the OCV change characteristic calculated from the composition correspondence mismatch capacity $\Delta Q_s$ and the single electrode capacity retention rates $k_1$ and $k_2$. The deterioration as expected is the wear deterioration when lithium is not precipitated, for example.

The current sum value (actually measured value) $\Delta Q_{21}$ is the sum (corresponding to a first sum value in the present invention) of the current values detected by the current sensor 32 during the change in open circuit voltage from $OCV\_H$ to $OCV\_M$, similarly to the current sum value (actually measured value) $\Delta Q_{11}$. The current sum value (estimated value) $\Delta Q_{22}$ is the value (corresponding to a second sum value in the present invention) calculated by calculating the OCV change characteristic on the battery model based on the composition correspondence mismatch capacity $\Delta Q_S$ and the single electrode capacity retention rates $k_1$ and $k_2$ identified with the open circuit voltages $OCV\_H$ and $OCV\_L$ and then using the calculated change characteristic and the open circuit voltages $OCV\_H$ and $OCV\_M$.

Figure 12:
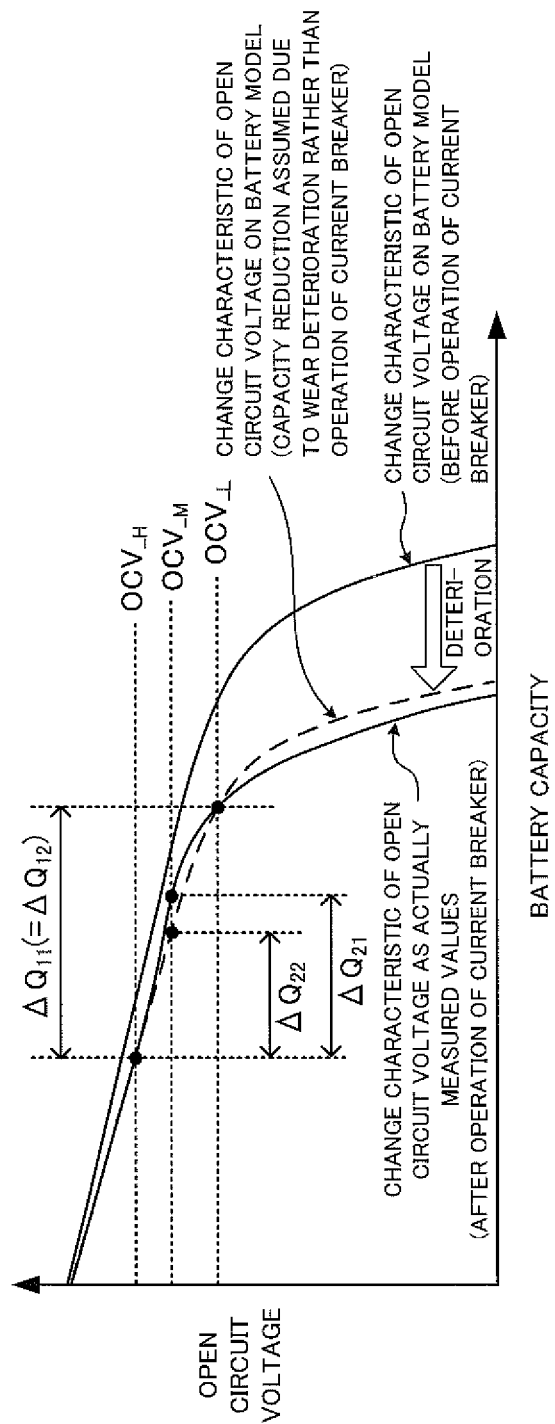
FIG. 12 is a graph showing the characteristic of changes in open circuit voltage on the battery model and the characteristic of change in open circuit voltage as actually measured values.

When the current breaker 12b is operated, the full charge capacity of the battery block 11 is reduced. As shown in FIG. 12, the current sum value (actually measured value) $\Delta Q_{21}$ is different from the current sum value (estimated value) $\Delta Q_{22}$, that is, the error between them falls outside the allowable range. Specifically, during the operation of the current breaker 12b, the OCV change characteristic is shifted from the OCV change characteristic (corresponding to a first voltage characteristic) observed when only the deterioration as expected occurs.

In FIG. 12, the vertical axis represents the open circuit voltage of the battery block 11 and the horizontal axis represents the capacity of the battery block 11. Although the description has been made of the model of the cell 12, the same idea as that for the model of the cell 12 is applicable to the battery block 11 including the plurality of cells 12. In FIG. 12, the OCV change characteristic in the battery model is the change characteristic seen when the model of the cell 12 is applied to the battery block 11.

In the example shown by FIG. 12, the current sum value (actually measured value) $\Delta Q_{21}$ is larger than the current sum value (estimated value) $\Delta Q_{22}$. FIG. 12 also shows the OCV change characteristic (change characteristic on the battery model) calculated from the composition correspondence mismatch capacity $\Delta Q_S$ and the single electrode capacity retention rates $k_1$ and $k_2$ assuming that the current breaker 12b is not operated and that the capacity is reduced due to the wear deterioration. An arrow shown in FIG. 12 indicates a reduction in battery capacity due to the deterioration.

In the present embodiment, it is determined that the current breaker 12b is operated when the difference between the current sum value (actually measured value) $\Delta Q_{21}$ and the current sum value (estimated value) $\Delta Q_{22}$ is equal to or larger than a predetermined amount.

When the battery block 11 (cell 12) is in the deteriorated state, the composition correspondence mismatch capacity $\Delta Q_S$ is changed, and the positive electrode capacity retention rate $k_1$ and the negative electrode capacity retention rate $k_2$ tend to be changed to different values. When the current breaker 12b included in the battery block 11 is operated, the result is simply no current passing through the cell 12 provided with that operating current breaker 12b. Thus, the positive electrode capacity retention rate $k_1$ and the negative electrode capacity retention rate $k_2$ are changed at an equal change rate.

When the current breaker 12b is operated and then no current passes through the cell 12, the capacity of the battery block 11 is only reduced without the deterioration of the battery block 11. Both the single electrode capacity retention rates $k_1$ and $k_2$ are changed according to the reduction in capacity of the battery block 11. Consequently, the change rate of the positive electrode capacity retention rate $k_1$ ($k_1/k_1'$) is equal to the change rate of the negative electrode capacity retention rate $k_2$ ($k_2/k_2'$).

In this case, $k_1'$ represents the positive electrode capacity retention rate of the battery block 11 before the operation of the current breaker 12b, $k_1$ represents the positive electrode capacity retention rate of the battery block 11 after the operation of the current breaker 12b. $k_2'$ represents the negative electrode capacity retention rate of the battery block 11 before the operation of the current breaker 12b, and $k_2$ represents the negative electrode capacity retention rate of the battery block 11 after the operation of the current breaker 12b.

When the battery block 11 is deteriorated, however, the change rate ($k_1/k_1'$) does not tend to be equal to the change rate ($k_2/k_2'$) in most cases.

The behavior of the deterioration parameters when the battery block 11 is deteriorated is different from that when the current breaker 12b is operated as described above, with the result that the current sum value (actually measured value) $\Delta Q_{21}$ is different from the current sum value (estimated value) $\Delta Q_{22}$. When only the deterioration occurs in the battery block 11, the current sum value (actually measured value) $\Delta Q_{21}$ is not significantly shifted from the current sum value (estimated value) $\Delta Q_{22}$ even with the estimation error of the current sum value (estimated value) $\Delta Q_{22}$ taken into account. When the current breaker 12b is operated, however, the current sum value (actually measured value) $\Delta Q_{21}$ is significantly shifted from the current sum value (estimated value) $\Delta Q_{22}$ beyond the estimation error of the current sum value (estimated value) $\Delta Q_{22}$.

Thus, in the present embodiment, the difference between the current sum value (actually measured value) $\Delta Q_{21}$ and the current sum value (estimated value) $\Delta Q_{22}$ is monitored to determine whether or not the current breaker 12b is operated.

Figure 13:
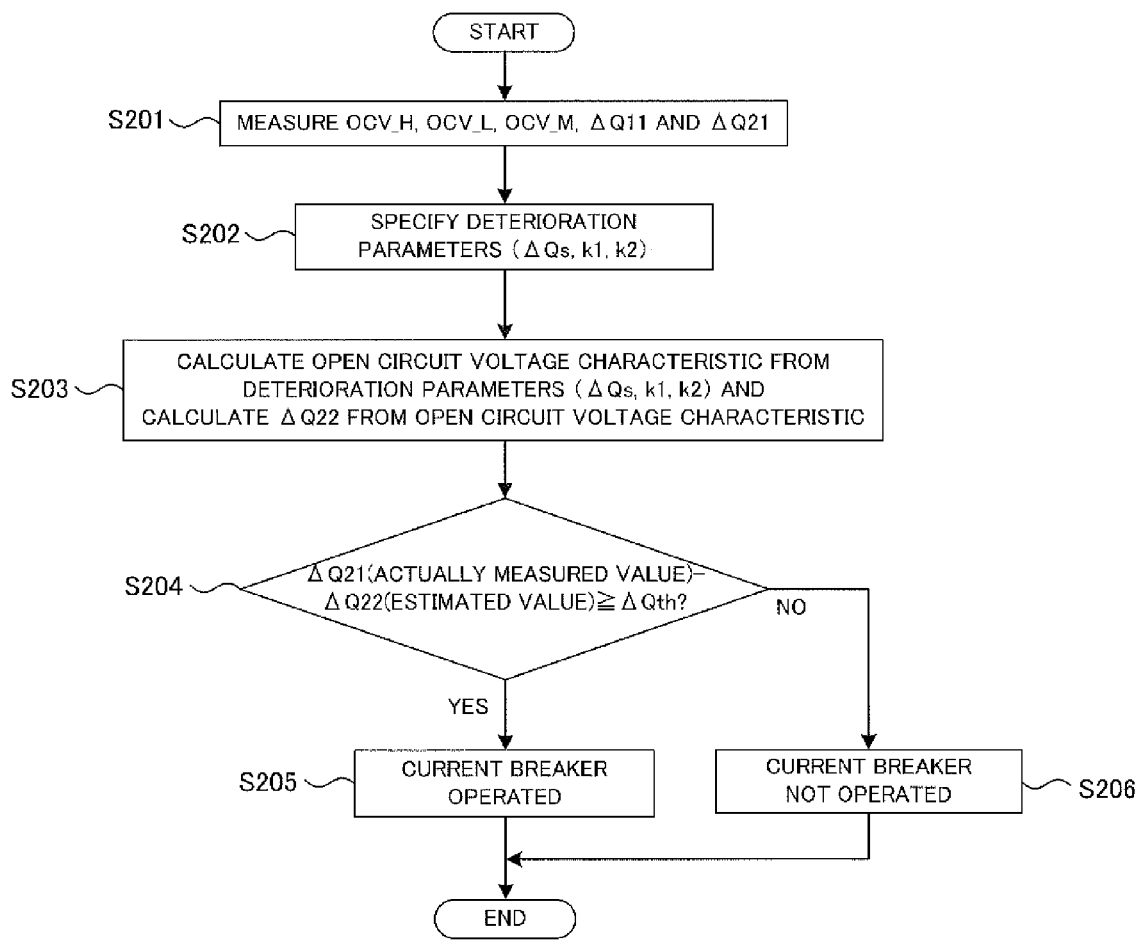
FIG. 13 is a flow chart showing the processing of determining the operating state of a current breaker.

FIG. 13 is a flow chart showing the processing of detecting the operation of the current breaker 12b. The processing shown in FIG. 13 is performed by the controller 40. The processing shown in FIG. 13 is performed for each of the battery blocks 11.

At step S201, the controller 40 acquires the open circuit voltages $OCV\_H$, $OCV\_L$, and $OCV\_M$ of the battery block 11 while discharging the assembled battery 10 (battery block 11). Each of the open circuit voltages $OCV\_H$, $OCV\_L$, and $OCV\_M$ can be acquired on the basis of the output from the monitor unit 20. Specifically, in a state where polarization of the assembled battery 10 (battery block 11) is reduced, the voltage value of the battery block 11 can be detected by the monitor unit 20 to acquire the open circuit voltages $OCV\_H$, $OCV\_L$, and $OCV\_M$.

At step S201, the controller 40 acquires the current sum value (actually measured value) $\Delta Q_{11}$ during the change in the open circuit voltage of the battery block 11 from $OCV\_H$ to $OCV\_L$. The controller 40 also acquires the current sum value (actually measured value) $\Delta Q_{21}$ during the change in the open circuit voltage of the battery block 11 from $OCV\_H$ to $OCV\_M$. Specifically, the controller 40 acquires the current sum values (actually measured values) $\Delta Q_{11}$ and $\Delta Q_{21}$ by summing the current values during the change in the open circuit voltage of the battery block 11 based on the output from the current sensor 32.

At step S202, the controller 40 specifies the deterioration parameters (composition correspondence mismatch capacity $\Delta Q_S$, positive electrode capacity retention rate $k_1$, and negative electrode capacity retention rate $k_2$) based on the open circuit voltages $OCV\_H$ and $OCV\_L$, and the current sum value (actually measured value) $\Delta Q_{11}$. The deterioration parameters can be specified with the processing shown in FIG. 11.

At step S203, the controller 40 calculates the OCV change characteristic (OCV change characteristic shown in FIG. 12) with respect to the local $SOC\theta_i$ as described above based on the deterioration parameters (composition correspondence mismatch capacity $\Delta Q_S$, and the single electrode capacity retention rates $k_1$ and $k_2$) specified at step S202. The controller 40 uses the calculated OCV change characteristic to calculate the current sum value (estimated value) $\Delta Q_{22}$ during the change in the open circuit voltage of the battery block 11 from $OCV\_H$ to $OCV\_M$.

At step S204, the controller 40 calculates the difference ($\Delta Q_{21} - \Delta Q_{22}$) between the current sum value (actually measured value) $\Delta Q_{21}$ acquired at step 201 and the current sum value (estimated value) $\Delta Q_{22}$ calculated at step S203. The controller 40 determines whether or not the absolute value of the difference ($\Delta Q_{21} - \Delta Q_{22}$) is equal to or higher than a predetermined value $\Delta Qth$. The predetermined value $\Delta Qth$ can be set as appropriate in view of an error in calculating (estimating) the OCV change characteristic. Specifically, when the error occurs in estimating the OCV change characteristic, an error also occurs in the current sum value (estimated value) $\Delta Q_{22}$, and when the absolute value of the difference ($\Delta Q_{21} - \Delta Q_{22}$) is larger than the error, it is found that the current sum value (actually measured value) $\Delta Q_{21}$ is different from the current sum value (estimated value) $\Delta Q_{22}$ due to a factor other than the estimation error.

When the absolute value of the difference ($\Delta Q_{21} - \Delta Q_{22}$) is equal to or higher than the predetermined value $\Delta Qth$, the controller 40 determines that the current breaker 12b is operated at step S205. In this case, it can be determined that at least one of the current breakers 12b is operated in the battery block 11. Alternatively, when the absolute value of the difference ($\Delta Q_{21} - \Delta Q_{22}$) is smaller than the predetermined value $\Delta Qth$, the controller 40 determines that no current breaker 12b is operated at step S206.

According to the present embodiment, the deterioration parameters are calculated from the open circuit voltages $OCV\_H$ and $OCV\_L$, and the current sum value (actually measured value) $\Delta Q_{11}$, and the OCV change characteristic is calculated on the basis of the deterioration parameters to allow the specification of the OCV change characteristic in the present battery block 11 which is in the advanced state of deterioration. The current sum value (estimated value) $\Delta Q_{22}$ specified from the OCV change characteristic observed when the battery block 11 is in the deterioration state can be compared with the current sum value (actually measured value) $\Delta Q_{21}$ to determine whether only the deterioration occurs or a factor other than the deterioration occurs in the battery block 11. When the current sum value (estimated value) $\Delta Q_{22}$ is significantly different from the current sum value (actually measured value) $\Delta Q_{21}$, it can be determined that the current breaker 12b is operated.

Although the present embodiment involves comparing the current sum value (actually measured value) $\Delta Q_{21}$ with the current sum value (estimated value) $\Delta Q_{22}$ to determine whether or not the current breaker 12b is operated, the present invention is not limited thereto.

For example, an open circuit voltage $OCV\_M$ is acquired by changing the open circuit voltage $OCV\_H$ by the current sum value (actually measured value) $\Delta Q_{21}$. The OCV change characteristic calculated from the deterioration parameters identified from the open circuit voltages $OCV\_H$ and $OCV\_L$, and the current sum value (actually measured value) $\Delta Q_{11}$ is used to calculate an open circuit voltage $OCV\_{M2}$ (corresponding to an estimated voltage in the present invention) when the open circuit voltage $OCV\_H$ is changed by the current sum value (actually measured value) $\Delta Q_{21}$. The open circuit voltage $OCV\_{M1}$ corresponds to the open circuit voltage $OCV\_M$. When only the deterioration occurs in the battery block 11, the open circuit voltage $OCV\_{M1}$ coincides with the open circuit voltage $OCV\_{M2}$. When the current breaker 12b is operated, however, the open circuit voltage $OCV\_{M1}$ is different from the open circuit voltage $OCV\_{M2}$. In the example shown by FIG. 12, the open circuit voltage $OCV\_{M2}$ is lower than the open circuit voltage $OCV\_{M1}$ (corresponding to the open circuit voltage $OCV\_M$).

When the open circuit voltage $OCV\_{M1}$ is compared with the open circuit voltage $OCV\_{M2}$ and the difference between them is equal to or higher than a predetermined value, it can be determined that the current breaker 12b is operated. The predetermined value can be set as appropriate in view of the error in estimating the OCV change characteristic, similarly to the setting of the predetermined value $\Delta Qth$.

Although the present embodiment includes acquiring the open circuit voltages $OCV\_H$, $OCV\_L$, and $OCV\_M$ of the battery block 11 while the assembled battery 10 (battery block 11) is discharged, the present invention is not limited thereto. It is only required that the different open circuit voltages $OCV\_H$, $OCV\_L$, and $OCV\_M$ should be acquired, and for example, the open circuit voltages $OCV\_H$, $OCV\_L$, and $OCV\_M$ of the battery block 11 can be acquired while the assembled battery 10 (battery block 11) is charged. In this case, the open circuit voltage of the battery block 11 can be changed from the open circuit voltage $OCV\_L$ toward the open circuit voltage $OCV\_H$.

Although the present embodiment includes acquiring the current sum value (actually measured value) $\Delta Q_{21}$ and the current sum value (estimated value) $\Delta Q_{22}$ during the change in open circuit voltage of the battery block 11 from $OCV\_H$ to $OCV\_M$, the present invention is not limited thereto. Specifically, the current sum values (actually measured value and estimated value) can be acquired during the change in the open circuit voltage of the battery block 11 from $OCV\_L$ to $OCV\_M$. In this case, these current sum values (actually measured value and estimated value) can be compared to determine whether or not the current breaker 12b is operated.

Although the present embodiment involves comparing the current sum value (actually measured value) $\Delta Q_{21}$ with the current sum value (estimated value) $\Delta Q_{22}$ relative to open circuit voltage $OCV\_M$ to determine whether or not the current breaker 12b is operated, the present invention is not limited thereto. Specifically, the current sum values (actually measured value and estimated value, corresponding to the current sum values $\Delta Q_{21}$ and $\Delta Q_{22}$) relative to any one of the open circuit voltages $OCV\_H$, $OCV\_L$, and $OCV\_M$ are compared to determine whether or not the current breaker 12b is operated.

For example, for acquiring the current sum value (estimated value) relative to the open circuit voltage $OCV\_H$, the deterioration parameters (composition correspondence mismatch capacity $\Delta Q_S$, positive electrode capacity retention rate $k_1$, and negative electrode capacity retention rate $k_2$) can be specified on the basis of the open circuit voltages $OCV\_L$, $OCV\_M$, and the current sum value (actually measured value) during the change in the open circuit voltage from $OCV\_L$ to $OCV\_M$. Next, the OCV change characteristic is calculated on the basis of the deterioration parameters, and the calculated change characteristic is used to calculate the current sum value (estimated value) during the change in the open circuit voltage from $OCV\_L$ (or $OCV\_M$) to $OCV\_H$.

Then, the current sum value (estimated value) can be compared with the current sum value (actually measured value) during the change in the open circuit voltage from $OCV\_L$ (or $OCV\_M$) to $OCV\_H$ to determine whether or not the current breaker 12b is operated. Instead of comparing the current sum values (actually measured value and estimated value), the open circuit voltage (corresponding to the $OCV\_{M1}$) as the actually measured value can be compared with the open circuit voltage (corresponding to the $OCV\_{M2}$) as the estimated value to determine whether or not the current breaker 12b is operated as described above.

When the operation of the current breaker 12b is detected, the controller 40 can limit the input/output of the assembled battery 10. This can reduce the charge and discharge currents of the assembled battery 10 to suppress an increase in current load on the cell 12 in the battery block 11 including the operating current breaker 12b.

When the current breaker 12b is operated in the battery block 11, no current passes through the cell 12 having the operating current breaker 12b. In the other cells 12 connected in parallel to the cell 12 having the operating current breaker 12b, a current passes which otherwise would pass through the cell 12 having the operating current breaker 12b. If the value of the current passing through the assembled battery 10 (battery block 11) is not limited, the value of the current passing through the other cells 12 is increased.

If the value of the current passing through the cell 12 is increased, that is, if the current load on the cell 12 is increased, high rate deterioration may easily occur. The high rate deterioration refers to deterioration caused by the ion concentration distribution in the electrolytic solution of the cell 12 biased toward one side (toward the positive electrode or the negative electrode) resulting from charge or discharge at a high rate. Since the ion concentration distribution biased toward one side suppresses the movement of ions between the positive electrode and the negative electrode, the input/output performance of the cell 12 is reduced to deteriorate the cell 12.

When the lithium-ion secondary battery is used as the cell 12, lithium may tend to be precipitated. The precipitation of lithium reduces the amount of lithium ions moving between the positive electrode and the negative electrode to result in a reduced full charge capacity of the cell 12. In addition, the increased value of the current passing through the cell 12 may easily operate the current breaker 12b.

The limitation of the value of the current passing through the assembled battery 10 can suppress the increase in current load on the cell 12. The value of current passing through the non-operating current breaker 12b can also be limited to prevent the current breaker 12b from being easily operated.

The charge and discharge control of the assembled battery 10 can be performed not only during the operation of the battery system shown in FIG. 1 but also during the supply of electric power from an external power source to the assembled battery 10 and during the supply of the electric power from the assembled battery 10 to external equipment. The external power source refers to a power source provided outside the vehicle, and a commercial power source can be used as the external power source, for example. The external equipment refers to electronic equipment which is disposed outside the vehicle and can be operated with the electric power from the assembled battery 10. A household appliance can be used as the external equipment, for example.

In supplying the electric power from the external power source to the assembled battery 10, a charger can be used.

The charger can convert the AC power from the external power source into a DC power and supply the DC power to the assembled battery 10. The charger can be mounted on the vehicle or can be provided outside and independently of the vehicle. The charger can convert the voltage value in the light of the voltage of the external power source and the voltage of the assembled battery 10. The controller 40 can control the operation of the charger to reduce the current value (charge current) of the assembled battery 10.

In supplying the electric power from the assembled battery 10 to the external equipment, a feeding apparatus can be used. The feeding apparatus can convert the DC power from the assembled battery 10 into an AC power and supply the AD power to the external equipment. The feeding apparatus can convert the voltage value in the light of the voltage of the assembled battery 10 and the voltage of the external equipment. The controller 40 can control the operation of the feeding apparatus to reduce the current value (discharge current) of the assembled battery 10.

Embodiment 2

Description is made of Embodiment 2 of the present invention. In the present embodiment, deterioration due to wear (deterioration described in Embodiment 1) is estimated by taking account of deterioration due to precipitation of lithium. A lithium-ion secondary battery is used as the cell 12.

Deterioration of the cell 12 actually includes both of deterioration due to precipitation of lithium and deterioration due to wear. When the deterioration due to the precipitation of lithium is predominant in the deterioration of the cell 12, deterioration parameters are changed in association with the deterioration due to precipitation of lithium. In this case, only the comparison between the current sum value (actually measured value) $\Delta Q_{21}$ and the current sum value (estimated value) $\Delta Q_{22}$ as described in Embodiment 1 does not reliably determine the operation of the current breaker 12b.

To address this, in the present embodiment, a composition correspondence mismatch capacity $\Delta Q_{S\_Li}$ associated with the precipitation of lithium is estimated to specify a composition correspondence mismatch capacity $\Delta Q_{S\_W}$ associated with the wear deterioration out of a composition correspondence mismatch capacity $\Delta Q_S$ of the battery block 11. Once the composition correspondence mismatch capacity $\Delta Q_{S\_W}$ can be specified, the method described in Embodiment 1 can be used to compare the current sum value (actually measured value) $\Delta Q_2$ and the current sum value (estimated value) $\Delta Q_{22}$ to detect the operation of the current breaker 12b.

Description is made of a method of estimating the composition correspondence mismatch capacity $\Delta Q_{S\_Li}$ associated with the precipitation of lithium. The processing of estimating the composition correspondence mismatch capacity $\Delta Q_{S\_Li}$ can be performed by a controller 40. The composition correspondence mismatch capacity $\Delta Q_{S\_Li}$ associated with the precipitation of lithium can be estimated at all times or can be estimated only when a condition is satisfied on which lithium tends to be precipitated. Since lithium tends to be precipitated when the cell 12 is in a low-temperature state, the low-temperature state can be specified as the condition on which lithium tends to be precipitated.

First, the temperature of the cell 12 is detected by using a temperature sensor 31, and an exchange current density in precipitation-dissolution reactions of lithium is calculated on the basis of the detected temperature. The exchange current density can be calculated, for example, based on the Arrhenius equation represented by the following expression (26).

$$i_{0,2}(T) = i_{0,2}(T_{ref}) \times \exp\left[\frac{E_{i0,2}}{R}\left(\frac{1}{T_{ref}} - \frac{1}{T}\right)\right] \tag{26}$$

In the above expression (26), R represents the gas constant [J/mol·K], T represents the absolute temperature [K], $T_{ref}$ represents a reference temperature [K], $i_{0,2}$ represents the exchange current density [A/cm$^2$] in the precipitation-dissolution reactions of lithium, $i_{0,2}(T_{ref})$ represents the exchange current density [A/cm$^2$] in the precipitation-dissolution reactions of lithium at the reference temperature, and $Ei_{0,2}$ represents an activation energy [kJ/mol]. The activation energy $Ei_{0,2}$ has temperature dependence, and for example, can be determined by performing AC impedance measurement at different temperatures in a cell including opposed electrodes made of lithium.

Next, a negative electrode potential deviation is calculated which is a difference between the potential of a negative electrode and the potential of lithium. The negative electrode potential deviation can be acquired, for example by measuring the potential difference between a reference electrode and the negative electrode. The reference electrode is disposed between a positive electrode and the negative electrode and is used for measuring the positive electrode potential and the negative electrode potential.

Next, a precipitation current density of lithium is calculated on the basis of the temperature of the cells 12, the exchange current density, and the negative electrode potential deviation. For example, the precipitation current density can be calculated on the basis of the Butler-Volmer equation represented by the following expression (27).

$$i_2 = i_{0,2}\left[\exp\left(\frac{\alpha_{a,2}F}{RT}\eta_{s,2}\right) - \exp\left(\frac{\alpha_{c,2}F}{RT}\eta_{s,2}\right)\right] \tag{27}$$

In the above expression (27), $i_2$ represents the precipitation current density of lithium [A/cm$^2$], $i_{0,2}$ represents the exchange current density [A/cm$^2$] in the precipitation-dissolution reactions of lithium, and $\alpha$ represents the transfer coefficient in oxidation (with a subscript a) or reduction (with a subscript c). F represents the Faraday's constant [C/mol], R represents the gas constant, T represents the absolute temperature, and $\eta_{S,2}$ represents an overvoltage [V] in the precipitation reaction and dissolution reaction. When $\eta_{S,2}$ has a negative value, that is, during precipitation of lithium, the overvoltage is set at the negative electrode potential deviation.

Next, a change amount of the lithium precipitation amount is calculated on the basis of a precipitation reaction surface area previously estimated and the precipitation current density presently calculated. The change amount of the lithium precipitation amount corresponds to a difference between the present lithium precipitation amount and the previous lithium precipitation amount. When the processing is performed for the first time, a preset initial value can be used as the precipitation reaction surface area.

The change amount of lithium precipitation amount corresponds to the amount of charge provided by the precipitation current passing through the cell 12 at a negative electrode potential lower than a lithium potential immediately after the previous estimation of the lithium precipitation amount. The amount of charge can be determined by multiplying the precipitation current value by the time for which the precipitation current passes. The precipitation current value can be determined by multiplying the precipitation current density by the precipitation reaction surface area.

Next, the change amount of the lithium precipitation amount from the previous processing is added to the previous lithium precipitation amount to calculate the present lithium precipitation amount. When the processing is performed for the first time, a preset initial value can be used as the previous lithium precipitation amount. The amount of charge corresponding to the present lithium precipitation amount can be calculated, for example on the basis of the following expression (28).

$$QLi_c = QLi_p + i_{2c} \times A2_p \times \frac{dt}{3600} \qquad (28)$$

In the above expression (28), a subscript c represents a presently estimated value, and a subscript p represents a previously estimated value. QLi represents the amount of charge [Ah] corresponding to the lithium precipitation amount, $i_2$ represents the lithium precipitation current density [A/cm$^2$], A2 represents the lithium precipitation reaction surface area, and dt represents a time period [seconds] for the processing of estimating the lithium precipitation amount. A second term in the right side of the above expression (28) specifies the change amount of the lithium precipitation amount.

For calculating the amount of charge corresponding to the lithium precipitation amount in the next processing, it is necessary to specify the present lithium precipitation reaction surface area. For example, once the relationship between the lithium precipitation amount and the precipitation reaction surface area is previously determined, the present precipitation reaction surface area can be specified from the present lithium precipitation amount. The precipitation amount QLi calculated on the basis of the above expression (28) corresponds to a composition correspondence mismatch capacity $\Delta Q_{S\_Li}$ associated with the precipitation of lithium.

The composition correspondence mismatch capacity $\Delta Q_{S\_Li}$ associated with the lithium precipitation can be subtracted from the composition correspondence mismatch capacity $\Delta Q_S$ calculated with the method described in Embodiment 1 to calculate the composition correspondence mismatch capacity $\Delta Q_{S\_W}$ associated with the wear deterioration.

After the calculation of the composition correspondence mismatch capacity $\Delta Q_{S\_W}$, single electrode capacity retention rates $k_1$ and $k_2$ can be specified on the basis of the composition correspondence mismatch capacity $\Delta Q_{S\_W}$. For example, when the relationship between the composition correspondence mismatch capacity $\Delta Q_{S\_W}$ and the single electrode capacity retention rates $k_1$ and $k_2$ is previously determined by an experiment or the like, the single electrode capacity retention rates $k_1$ and $k_2$ can be specified from the composition correspondence mismatch capacity $\Delta Q_{S\_W}$. Information representing the relationship between the composition correspondence mismatch capacity $\Delta Q_{S\_W}$ and the single electrode capacity retention rates $k_1$ and $k_2$ can be determined by using the cell 12 in which only the deterioration due to wear is caused.

In the deterioration due to the precipitation of lithium, the single electrode capacity retention rates $k_1$ and $k_2$ are hardly changed and the composition correspondence mismatch capacity $\Delta Q_S$ is significantly changed. The composition correspondence mismatch capacity $\Delta Q_{S\_W}$ associated with the precipitation of lithium can be subtracted from the composition correspondence mismatch capacity $\Delta Q_S$ to improve the accuracy in specifying the single electrode capacity retention rates $k_1$ and $k_2$.

After the specification of the optimal deterioration parameters, as described in Embodiment 1, the current sum value (estimated value) $\Delta Q_{22}$ is calculated. As described in Embodiment 1, a difference between the current sum value (estimated value) $\Delta Q_{22}$ and the current sum value (actually measured value) $\Delta Q_{21}$ can be used to determine whether or not the current breaker 12b is operated.

The invention claimed is:

1. An electric storage system comprising:
    a plurality of electric storage blocks connected in series, each of the plurality of electric storage blocks including a plurality of electric storage elements connected in parallel;
    a plurality of current breakers, each of the plurality of current breakers being provided for each of the plurality of electric storage elements and being configured to break a current path in the electric storage element;
    a voltage sensor configured to acquire an open circuit voltage of the electric storage block; and
    a controller configured to determine an operating state of the current breaker included in the electric storage block, wherein
    in each of the plurality of electric storage blocks, a single electrode capacity retention rate is defined by dividing a capacity of a single electrode in a deteriorated state by a capacity of the single electrode in an initial state, and a variation of a capacity of the electric storage block is defined by multiplying a capacity of a negative electrode in the deteriorated state by a shift amount of a negative electrode composition axis relative to a positive electrode composition axis, and
    the controller determines that the current breaker is operated when a first voltage characteristic is shifted from a second voltage characteristic, the first voltage characteristic being acquired from the voltage sensor and indicating a change in the open circuit voltage with respect to the capacity of the electric storage block, the second voltage characteristic being calculated from the capacity retention rate and the variation of the capacity and indicating a change in the open circuit voltage with respect to the capacity of the electric storage block.

2. The electric storage system according to claim 1, further comprising a current sensor configured to acquire a current passing through the electric storage block,
    wherein the controller calculates a first sum value by summing currents acquired from the current sensor during a change in the open circuit voltage of the electric storage block from a first voltage to a second voltage,
    the controller calculates a second sum value by using the second voltage characteristic, the second sum value being a current sum value during a change in the open circuit voltage of the electric storage block from the first voltage to the second voltage, and
    the controller determines that the current breaker is operated when a difference between the first sum value and the second sum value is equal to or larger than a predetermined value.

3. The electric storage system according to claim 1, further comprising a current sensor configured to acquire a current passing through the electric storage block,
wherein the controller calculates a sum value by summing currents acquired from the current sensor during a change in the open circuit voltage of the electric storage block from a first voltage to a second voltage,
the controller calculates an estimated voltage by using the second voltage characteristic, the estimated voltage being a voltage obtained when the capacity of the electric storage block is changed by the sum value from a capacity level associated with the first voltage, and
the controller determines that the current breaker is operated when a difference between the second voltage and the estimated voltage is equal to or larger than a predetermined value.

4. The electric storage system according to claim 2, wherein the first voltage characteristic and the second voltage characteristic show an equal characteristic at the first voltage and a third voltage, the third voltage being different from the second voltage.

5. The electric storage system according to claim 1, wherein the deteriorated state is a deteriorated state occurring due to wear of the electric storage element.

6. The electric storage system according to claim 1, wherein, when the electric storage element is a lithium-ion secondary battery, the variation of the capacity is a variation excluding a variation of the capacity due to precipitation of lithium.

7. The electric storage system according to claim 3, wherein the first voltage characteristic and the second voltage characteristic show an equal characteristic at the first voltage and a third voltage, the third voltage being different from the second voltage.

* * * * *